United States Patent
Shimizu et al.

(10) Patent No.: US 9,565,775 B2
(45) Date of Patent: Feb. 7, 2017

(54) WIRING BOARD, SEMICONDUCTOR DEVICE, AND METHOD OF MANUFACTURING WIRING BOARD

(71) Applicant: SHINKO ELECTRIC INDUSTRIES CO., LTD., Nagano-ken (JP)

(72) Inventors: Noriyoshi Shimizu, Nagano (JP); Wataru Kaneda, Nagano (JP); Hiromu Arisaka, Nagano (JP); Akio Rokugawa, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 206 days.

(21) Appl. No.: 14/469,782

(22) Filed: Aug. 27, 2014

(65) Prior Publication Data
US 2015/0062851 A1 Mar. 5, 2015

(30) Foreign Application Priority Data
Sep. 2, 2013 (JP) ................................. 2013-181381

(51) Int. Cl.
*H05K 1/11* (2006.01)
*H05K 3/42* (2006.01)
(Continued)

(52) U.S. Cl.
CPC .............. *H05K 3/421* (2013.01); *H05K 1/115* (2013.01); *H01L 2224/16225* (2013.01);
(Continued)

(58) Field of Classification Search
CPC ............... H05K 2201/09481; H05K 2201/095; H05K 2201/0949; H05K 2201/09509; H05K 2201/09518; H05K 2201/09527; H05K 2201/09536; H05K 2201/09545;H05K 2201/09554; H05K 2201/09563; H05K 2201/09572; H05K 2201/09581; H05K 2201/0959; H05K 2201/096; H05K 2201/09609; H05K 2201/09618; H05K 2201/09627; H05K 2201/09645; H05K 2201/09836; H05K 2201/09827; H05K 2201/09854; H05K 2201/09863; H05K 1/0206; H05K 1/0221; H05K 1/0222; H05K 1/0251; H05K 1/112; H05K 1/114; H05K 1/115; H05K 1/116; H05K 2201/09809; H01L 23/5226
(Continued)

(56) References Cited

U.S. PATENT DOCUMENTS

2011/0284277 A1* 11/2011 Kato ...................... H05K 1/113
174/258

FOREIGN PATENT DOCUMENTS

JP    2003-023252    1/2003
JP    2003-023253    1/2003

* cited by examiner

Primary Examiner — Binh Tran
(74) Attorney, Agent, or Firm — Fish & Richardson P.C.

(57) ABSTRACT

A wiring board includes a first insulating layer coating a first wiring layer. A first through hole is opened in a surface of the first insulating layer and exposes a surface of the first wiring layer. A first via arranged in the first through hole includes an end surface exposed to the surface of the first insulating layer. A gap is formed between the first insulating layer and the first via in the first through hole. A second wiring layer is stacked on the surface of the first insulating layer and the end surface of the first via. The second wiring layer includes a pad filling the gap. The pad is greater in planar shape than the first through hole.

13 Claims, 18 Drawing Sheets

(51) Int. Cl.
  *H05K 1/00*    (2006.01)
  *H05K 1/18*    (2006.01)
  *H05K 7/10*    (2006.01)
  *H05K 3/38*    (2006.01)
  *H05K 3/46*    (2006.01)

(52) U.S. Cl.
  CPC ............... *H01L 2224/32225* (2013.01); *H01L 2224/73204* (2013.01); *H01L 2924/15311* (2013.01); *H05K 1/116* (2013.01); *H05K 3/38* (2013.01); *H05K 3/4644* (2013.01); *H05K 2201/0338* (2013.01); *H05K 2201/0352* (2013.01); *H05K 2201/096* (2013.01); *H05K 2201/0979* (2013.01); *H05K 2201/09381* (2013.01); *H05K 2201/09481* (2013.01); *H05K 2201/09563* (2013.01); *H05K 2201/09827* (2013.01); *H05K 2201/09854* (2013.01); *H05K 2201/2072* (2013.01); *H05K 2203/0789* (2013.01)

(58) Field of Classification Search
  USPC .......... 361/748, 760, 761; 174/250, 261–267
  See application file for complete search history.

WIRING BOARD, SEMICONDUCTOR DEVICE, AND METHOD OF MANUFACTURING WIRING BOARD

CROSS-REFERENCE TO RELATED APPLICATIONS

This application is based upon and claims the benefit of priority from prior Japanese Patent Application No. 2013-181381, filed on Sep. 2, 2013, the entire contents of which are incorporated herein by reference.

FIELD

The present disclosure relates to a wiring board, a semiconductor device, and a method of manufacturing the wiring board.

BACKGROUND

A conventional wiring board includes a multilayer wiring formed according to a buildup technique (see Japanese Laid-Open Patent Publication Nos. 2003-023252 and 2003-023253, for example). The buildup technique forms a multilayer wiring by repeatedly forming insulating layers, through holes, electric wires by use of electrolytic plating, for example.

An electronic component, such as a semiconductor chip, is mounted on a wiring layer of a wiring board. The wiring layer of a wiring board has been miniaturized with the enhancement in performance of the electronic component.

SUMMARY

In a typical process for forming a multilayer wiring in accordance with a semi-additive method, a through hole is formed in an insulating layer on a wiring layer by laser irradiation, thereafter desmearing is performed to remove a resin smear in the through hole, and a via is formed in the through hole. The surface of the insulating layer is also etched by the desmearing, and is roughened. A wiring layer adheres tightly onto the insulating layer by the anchor effect of the roughened insulating layer. The inventors of the present application have noticed that, when the surface of the insulating layer is roughened, it may be difficult to form a fine wiring layer on the insulating layer. For example, if the wiring layer is narrowed in pitch, residues may be likely to occur because of the ruggedness of the surface of the roughened insulating layer when a seed layer is etched, and an electric short circuit may be likely to occur between the wiring layers. When the surface of the insulating layer is roughened, it may be difficult to deal with the miniaturization (pitch-narrowing) of a wiring layer.

One aspect of the present invention is a wiring board including a first insulating layer coating a first wiring layer. A first through hole is opened in a surface of the first insulating layer and exposes a surface of the first wiring layer. A first via is arranged in the first through hole and includes an end surface exposed to the surface of the first insulating layer. A gap is formed between the first insulating layer and the first via in the first through hole. A second wiring layer is stacked on the surface of the first insulating layer and on the end surface of the first via and includes a pad. The pad fills the gap. The pad is greater in planar shape than the first through hole.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF EMBODIMENTS

Figure 1A:
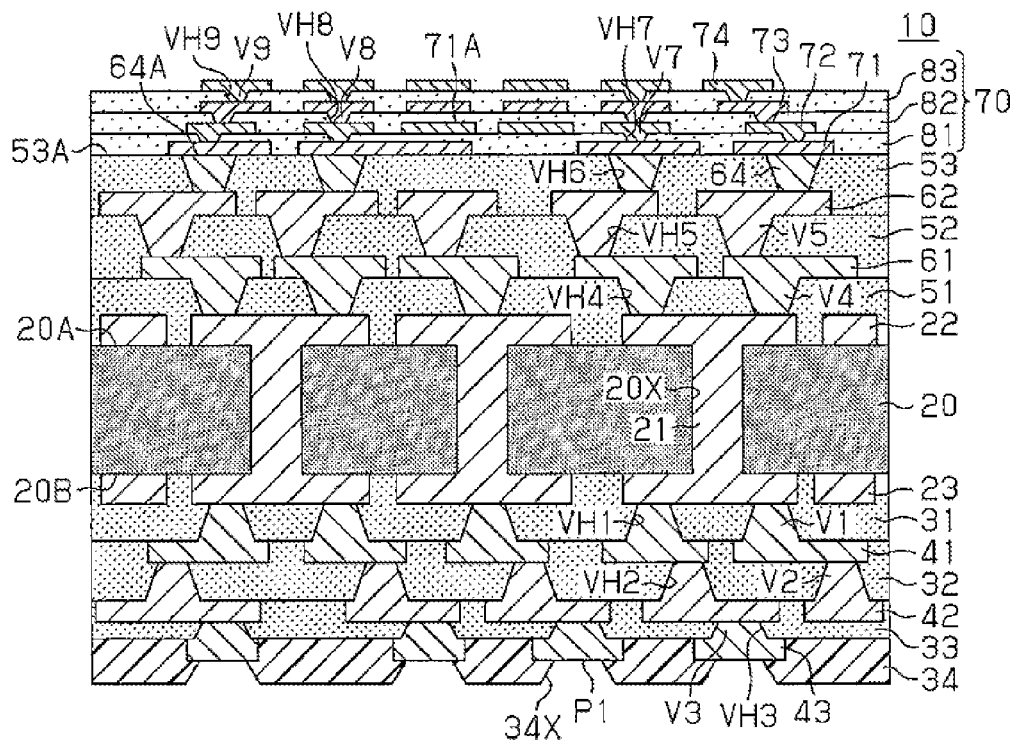
FIG. 1A is a schematic cross-sectional view illustrating a wiring board of one embodiment.

In the drawings, elements are illustrated for simplicity and clarity and have not necessarily been drawn to scale. To facilitate understanding, hatching lines may not be illustrated in the cross-sectional views.

A first embodiment will now be described.

As illustrated in FIG. 1A, a wiring board 10 includes a core board 20 at a middle region in a thickness direction. The core board 20 may be a so-called glass epoxy board formed by, for example, impregnating a reinforcement material with thermosetting insulating resin and then hardening. The reinforcement material may be cloth, such as woven glass fabrics, nonwoven glass fabrics, woven aramid fabrics, nonwoven aramid fabrics, woven liquid crystal polymer (LCP) fabrics, or nonwoven LCP fabrics. The thermosetting insulating resin may be, for example, epoxy resin, polyimide resin, or cyanate resin. The thickness of the core board 20 may be, for example, about 80 to 800 μm.

The core board 20 is provided with through holes 20X arranged in predetermined places (three places in FIG. 1A). The through hole 20X penetrates from an upper surface 20A to a lower surface 20B of the core board 20. A through electrode 21 that passes through the core board 20 in the thickness direction is formed in the through hole 20X. The inside of the through hole 20X is filled with the through electrode 21. The through electrode 21 is formed in, for example, a substantially circular shape as viewed in plan view. The diameter of the through electrode 21 may be, for example, about 50 to 100 μm. The material usable for the through electrode 21 may be, for example, copper (Cu) or a copper alloy.

A wiring layer 22 is formed on the upper surface 20A of the core board 20, and a wiring layer 23 is formed on the lower surface 20B of the core board 20. These wiring layers 22 and 23 are electrically connected together through the through electrode 21. The material usable for the wiring layers 22 and 23 may be, for example, copper or a copper alloy. The thickness of each of the wiring layers 22 and 23 may be, for example, about 15 to 35 μm.

An insulating layer 31 with which the wiring layer 23 is coated, a wiring layer 41 stacked on the lower surface of the insulating layer 31, an insulating layer 32 with which the wiring layer 41 is coated, and a wiring layer 42 stacked on the lower surface of the insulating layer 32 are stacked in this order on the lower surface 20B of the core board 20. An insulating layer 33 with which the wiring layer 42 is coated, a wiring layer 43 stacked on the lower surface of the insulating layer 33, and a solder resist layer 34 stacked on the lower surface of the insulating layer 33 so as to coat a part of the wiring layer 43 therewith are stacked in this order on the lower surface of the insulating layer 32.

A through hole VH1 that passes through the insulating layer 31 in the thickness direction is formed in the insulating layer 31 at a predetermined place. A via V1 by which the wiring layer 23 and the wiring layer 41 are electrically connected together is formed in the through hole VH1. The through hole VH1 is filled with the via V1. A through hole VH2 that passes through the insulating layer 32 in the thickness direction is formed in the insulating layer 32 at a predetermined place. A via V2 by which the wiring layer 41 and the wiring layer 42 are electrically connected together is formed in the through hole VH2. The through hole VH2 is filled with the via V2. A through hole VH3 that passes through the insulating layer 33 in the thickness direction is formed in the insulating layer 33 at a predetermined place. A via V3 by which the wiring layer 42 and the wiring layer 43 are electrically connected together is formed in the through hole VH3. The through hole VH3 is filled with the via V3. These through holes VH1, VH2, VH3 and vias V1, V2, V3 are formed in a tapered manner such that the diameter becomes greater from the upper side (core-board 20 side) toward the lower side (wiring-layer 43 side) in FIG. 1A. For example, the through holes VH1, VH2, and VH3 are each formed in a truncated cone shape in which the opening diameter of an upper opening end becomes smaller than the opening diameter of a lower opening end, and the vias V1, V2, and V3 are each formed in a truncated cone shape in which the upper surface is smaller in diameter than the lower surface.

Herein, the thickness of each of the wiring layers 41, 42, and 43 may be, for example, about 15 to 20 μm. The thickness from the lower surface of the wiring layer 23 to the lower surface of the insulating layer 31, the thickness from the lower surface of the wiring layer 41 to the lower surface of the insulating layer 32, and the thickness from the lower surface of the wiring layer 42 to the lower surface of the insulating layer 33 may be, for example, about 15 to 35 μm. The material usable for the wiring layers 41, 42, and 43 and the vias V1, V2, and V3 may be, for example, copper or a copper alloy. The material usable for the insulating layers 31, 32, and 33 may be, for example, insulating resin, such as epoxy resin or polyimide resin, or resin material produced by mixing a filler, such as silica or alumina, with the insulating resin. The material usable for the insulating layers 31, 32, and 33 may be, for example, insulating resin that has thermosetting properties and non-photosensitive insulating resin that has thermosetting properties.

An opening portion 34X to expose a part of the lowermost wiring layer 43 as an external connection pad P1 is formed in the solder resist layer 34. An external connection terminal 96 (see FIG. 3), such as a solder ball or a lead pin, which is used when the wiring board 10 is mounted on a mounting board, such as a mother board, is connected to the external connection pad P1. If needed, an OSP (Organic Solderability Preservative) film may be formed by applying an OSP process onto the wiring layer 43 exposed from the opening portion 34X, and the external connection terminal 96 may be connected to the OSP film. The material usable for the OSP film may be, for example, imidazole compound and azole compound. A metal layer may be formed on the wiring layer 43 exposed from the opening portion 34X, and the external connection terminal 96 may be connected to the metal layer. For example, a gold (Au) layer, or a nickel (Ni)/Au layer (i.e., a metal layer in which an Ni layer and an Au layer are stacked in this order), or an Ni layer/palladium (Pd) layer/Au layer (i.e., a metal layer in which an Ni layer, a Pd layer, and an Au layer are stacked in this order) may be referred to as the metal layer. These Ni layer, Au layer, and Pd layer may be, for example, metal layers (electroless-plating metal layers) formed by an electroless plating method. The Ni layer is an Ni metal layer or an Ni alloy layer, and the Au layer is an Au metal layer or an Au alloy layer, and the Pd layer is a Pd metal layer or a Pd alloy layer. The wiring layer 43 that is exposed from the opening portion 34X (or from an OSP film or a metal layer if the OSP film or the metal layer is formed on the wiring layer 43) may function as an external connection terminal.

The planar shape of the opening portion 34X and the planar shape of the external connection pad P1 may be, for example, circular, and the diameter may be, for example, about 200 to 300 μm. The thickness from the lower surface of the wiring layer 43 to the lower surface of the solder resist layer 34 may be, for example, about 20 to 40 μm. The material usable for the solder resist layer 34 may be, for example, insulating resin, such as epoxy resin or acrylic resin.

An insulating layer 51 with which the wiring layer 22 is coated, a wiring layer 61 stacked on the upper surface of the insulating layer 51, an insulating layer 52 with which the wiring layer 61 is coated, a wiring layer 62 stacked on the upper surface of the insulating layer 52, and an insulating layer 53 with which the wiring layer 62 is coated are stacked in this order on the upper surface 20A of the core board 20.

A through hole VH4 that passes through the insulating layer 51 in the thickness direction is formed in the insulating layer 51 at a predetermined place. A via V4 by which the wiring layer 22 and the wiring layer 61 are electrically connected together is formed in the through hole VH4. The through hole VH4 is filled with the via V4. A through hole VH5 that passes through the insulating layer 52 in the thickness direction is formed in the insulating layer 52 at a predetermined place. A via V5 by which the wiring layer 61 and the wiring layer 62 are electrically connected together is formed in the through hole VH5. The through hole VH5 is filled with the via V5. These through holes VH4, VH5 and vias V4, V5 are formed in a tapered manner such that the diameter becomes greater from the lower side (core-board 20 side) toward the upper side in FIG. 1A. For example, the through holes VH4 and VH5 are each formed in a reverse-truncated cone shape in which the opening diameter of an upper opening end is greater than the opening diameter of a lower opening end, and the vias V4 and V5 are each formed in a reverse-truncated cone shape in which the upper surface is greater in diameter than the lower surface.

Herein, the thickness of each of the wiring layers 61 and 62 may be, for example, about 15 to 20 μm. The thickness from the upper surface of the wiring layer 22 to the upper surface of the insulating layer 51, the thickness from the upper surface of the wiring layer 61 to the upper surface of the insulating layer 52, and the thickness from the upper surface of the wiring layer 62 to the upper surface 53A of the insulating layer 53 may be, for example, about 15 to 35 μm. The material usable for the wiring layers 61 and 62 and the vias V4 and V5 may be, for example, copper or a copper alloy. The material usable for the insulating layers 51, 52, and 53 may be, for example, insulating resin, such as epoxy resin or polyimide resin, or resin material produced by mixing a filler, such as silica or alumina, with the insulating resin. The material usable for the insulating layers 51, 52, and 53 may be, for example, insulating resin that has thermosetting properties and non-photosensitive insulating resin that has thermosetting properties.

A through hole VH6, which is opened at a predetermined place of the upper surface 53A of the insulating layer 53 and by which a part of the upper surface (surface) of the wiring layer 62 is exposed while passing through the insulating layer 53 in the thickness direction, is formed in the insulating layer 53. The through hole VH6 is formed in a tapered manner such that the diameter becomes greater from the lower side (wiring-layer 62 side) toward the upper side (upper-surface side (53A) of the insulating layer 53) in FIG. 1A. For example, the through hole VH6 is formed in a reverse-truncated cone shape in which the opening diameter of an upper opening end is greater than the opening diameter of a lower opening end. In this case, the through hole VH6 is formed in a substantially inverted trapezoidal shape as viewed in cross section, and is formed in a substantially circular shape as viewed in plan view.

The depth of the through hole VH6 may be, for example, about 15 to 35 μm. The opening diameter of the through hole VH6 may be, for example, about 50 to 60 μm.

The upper surface 53A of the insulating layer 53 is a less-rugged smooth surface (low-roughness surface). For example, the upper surface 53A of the insulating layer 53 is lower in surface roughness than the inner surface of the through hole VH6. The roughness of the upper surface 53A of the insulating layer 53 is set so as to have a surface roughness (Ra) value of, for example, about 10 to 200 nm. The roughness of the inner surface of the through hole VH6 is set so as to have a surface roughness (Ra) value of, for example, about 100 to 300 nm. Herein, the surface roughness (Ra) value is a kind of numerical value that represents surface roughness, and is called arithmetic mean roughness, and, in more specifically, is an arithmetic mean value obtained by measuring the absolute value of a height that changes in a measurement range from a surface regarded as an average line.

A via 64 by which the wiring layer 62 and the wiring layer 71 formed on the upper surface 53A of the insulating layer 53 are electrically connected together is formed in the through hole VH6. The via 64 passes through the insulating layer 53 in the thickness direction. The via 64 is formed in a tapered manner such that the diameter becomes greater from the lower side (wiring-layer 62 side) toward the upper side (wiring-layer 71 side) in FIG. 1A in the same way as the through hole VH6. For example, the via 64 is formed in a substantially reverse-truncated cone shape in which an upper end surface 64A is greater in diameter than the lower surface. The diameter of the upper end surface 64A of the via 64 may be, for example, about 50 to 60 μm.

Figure 1B:
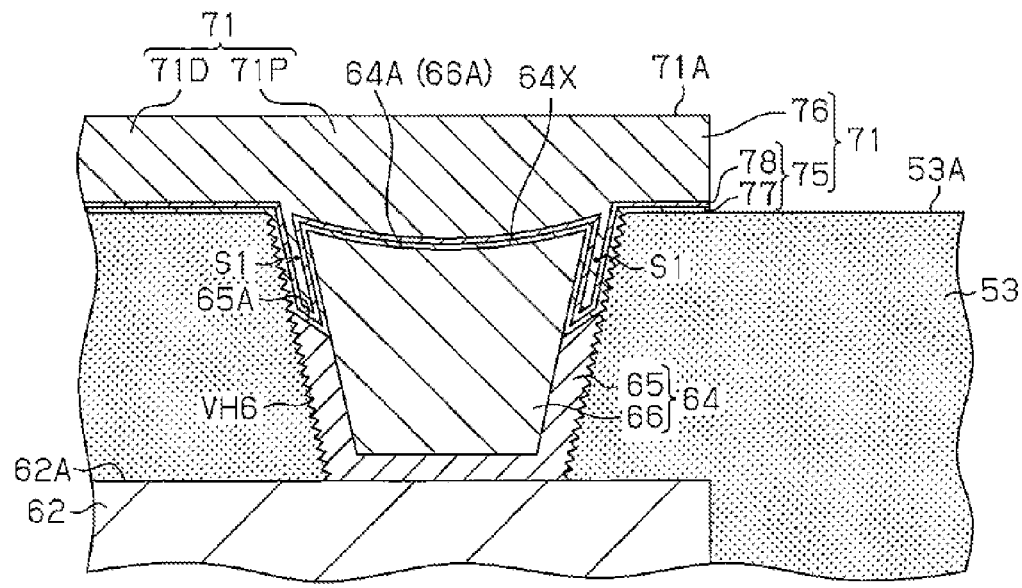
FIG. 1B is an enlarged cross-sectional view in which a part of the wiring board illustrated in FIG. 1A is enlarged.

As illustrated in FIG. 1B, the via 64 includes a metal layer 65 with which the inner surface and the bottom of the through hole VH6 are coated and a metal layer 66 formed on the metal layer 65. For example, the metal layer 65 wholly coats a rugged portion, i.e., both a concave portion and a convex portion formed on the inner surface of the through hole VH6 therewith, and coats the bottom of the through hole VH6, i.e., the upper surface 62A of the wiring layer 62 exposed from the through hole VH6 therewith. Although the metal layer 65 is formed on the inner surface of the through hole VH6, this is not formed on the upper surface 53A of the insulating layer 53. In other words, the metal layer 65 does not extend to the upper surface 53A of the insulating layer 53. For example, the metal layer 65 exposes the inner surface of a part of the upper side (wiring-layer 71 side) of the inner surface of the through hole VH6 in FIG. 1B. In other words, an upper end surface 65A of the metal layer 65 is formed at a position lower than the upper surface 53A of the insulating layer 53. The metal layer 65 may be, for example, a metal layer formed by the electroless plating method. The metal layer 65 formed by the electroless plating method may be, for example, a copper layer. The thickness of the metal layer 65 may be, for example, about 0.1 to 1 μm.

The metal layer 66 is formed in the through hole VH6 inside the metal layer 65 so as to coat a part of the surface of the metal layer 65 therewith. For example, the metal layer 66 coats the entire upper surface of the metal layer 65 with which the upper surface 62A of the wiring layer 62 is coated, and coats the entire side surface of the metal layer 65 with which the inner surface of the through hole VH6 is coated. The metal layer 66 in the present example is formed in a substantially reverse-truncated cone shape in which the upper end surface 66A is greater in diameter than the lower surface. The upper end surface 66A of the metal layer 66 is formed at, for example, a position lower than the upper surface 53A of the insulating layer 53. The metal layer 66 may be, for example, a metal layer formed by the electrolytic plating method. The material usable for the metal layer 66 may be, for example, copper or a copper alloy.

A concave portion 64X, which is concaved toward the wiring-layer side (62) (downwardly) that is lower than the upper surface 53A of the insulating layer 53, is formed on the upper end surface 66A of the metal layer 66. For example, the concave portion 64X is formed in a substantially half ellipse as viewed in cross section. In other words, the bottom surface of the concave portion 64X is more concaved in a curved manner toward the lower side than the upper surface 53A so as to have a curved surface.

A gap S1 (space) is formed between the via 64 and the insulating layer 53 on the upper surface side (53A) in the through hole VH6. In the illustrated example, a gap S1 is formed between the metal layer 66 and the inner surface (insulating layer 53) of the through hole VH6 exposed from the metal layer 65.

Figure 2A:
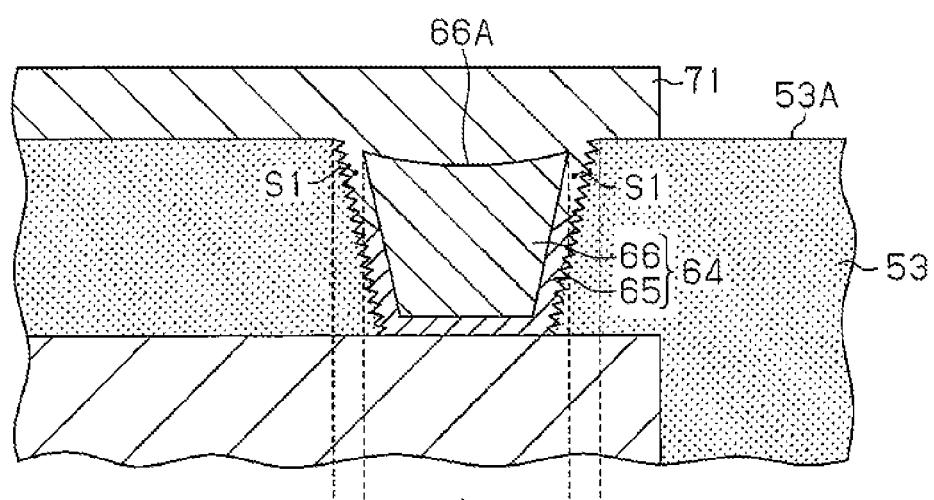
FIGS. 2A and 2B are descriptive views, each illustrating a gap.
Figure 2B:
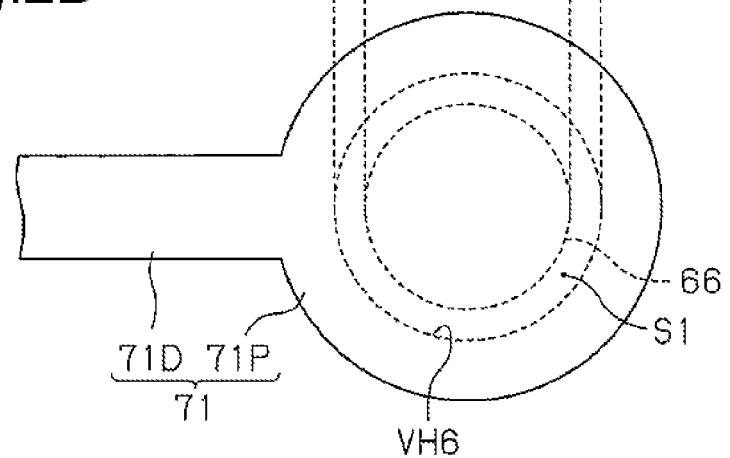

As illustrated in FIGS. 2A and 2B, the gap S1 is annularly formed along the outer peripheral edge of the through hole VH6. The diameter Φ1 of the upper end surface 66A of the metal layer 66 is shorter than the opening diameter Φ2 of the opening end closer to the upper surface 53A of the through hole VH6. The depth of the gap S1 may be, for example, about 2 to 8 μm, and the width of the gap S1 may be, for example, about 0.1 to 1 μm.

As illustrated in FIG. 1A, a fine wiring structure 70 in which wring layers that are finer than the wiring layers 61 and 62 are stacked is stacked on the upper surface 53A of the insulating layer 53. The fine wiring structure 70 has a structure in which a wiring layer 71 stacked on the insulating layer 53, an insulating layer 81 with which the wiring layer 71 is coated, a wiring layer 72 stacked on the upper surface of the insulating layer 81, an insulating layer 82 with which the wiring layer 72 is coated, a wiring layer 73 stacked on the upper surface of the insulating layer 82, an insulating layer 83 with which the wiring layer 73 is coated, and a wiring layer 74 stacked on the upper surface of the insulating layer 83 are stacked in this order.

The wiring layers 71 to 74 are wiring layers formed more finely than the wiring layers 61 and 62 formed below the fine wiring structure 70. For example, the wiring layers 61 and 62 are wirings equal to or greater than line/space (L/S)=10 μm/10 μm. On the other hand, the wiring layers 71 to 74 are, for example, fine wirings less than L/S=5 μm/5 μm. For example, the wiring layer 71 is a fine wiring of about L/S=3 to 4 μm/3 to 4 μm. The wiring layers 72 to 74 are fine wirings of about L/S=2 μm/2 μm. The wiring layers 71 to 74 are wiring layers that are thinner than the wiring layers 61 and 62 formed below the fine wiring structure 70. For example, the thickness of each of the wiring layers 71 to 73 may be about 1 to 5 μm (suitably, 2.5 to 3.0 μm), and the thickness of the wiring layer 74 may be about 5 to 10 μm. Preferably, these wiring layers 71 to 74 are each formed to have, for example, the same thickness as the insulating layers 81 to 83 formed on the wiring layers 71 to 73, or are each formed more thinly than the insulating layers 81 to 83 formed on the wiring layers 71 to 73.

As illustrated in FIG. 1B, the wiring layer 71 is stacked on the upper surface 53A of the insulating layer 53 so as to be connected to the upper end surface 64A of the via 64. The wiring layer 71 fills the concave portion 64X of the via 64, and fills the gap S1, and coats a part of the upper surface 53A of the insulating layer 53 formed around the via 64. The wiring layer 71 coats the entire upper end surface 66A of the metal layer 66, the upper end surface 65A of the metal layer 65, the inner surface of the through hole VH6 exposed from the metal layer 65, and the side surface of the metal layer 66. The wiring layer 71 comes into contact with the upper surface 53A of the insulating layer 53 and with the side surface of the insulating layer 53 (i.e., the inner surface of the through hole VH6). As illustrated in FIG. 2B, the wiring layer 71 includes a pad 71P with which the upper end surface 64A of the via 64 and the upper surface 53A of the insulating layer 53 therearound are coated. The wiring layer 71 is formed at positions at which the wiring layer 71 coincides with the via 64 and the through hole VH6 as viewed in plan view, and includes the pad 71P formed larger in the planar shape than the through hole VH6. For example, the wiring layer 71 includes a lead wire 71D that draws out the wiring layer 71 from the pad 71P in the planar direction.

The upper surface 71A of the wiring layer 71 (the pad 71P and the lead wire 71D) is a flat surface. The upper surface 71A of the wiring layer 71 is formed more flatly than the upper end surface 64A of the via 64. More specifically, the upper surface 71A of the wiring layer 71 formed directly on the via 64 (the upper surface of the pad 71P) is formed more flatly than the upper end surface 64A of the via 64. For example, the upper surface 71A of the wiring layer 71 is formed to be a flat surface parallel to the upper surface 53A of the insulating layer 53.

As illustrated in FIG. 1B, the wiring layer 71 includes, for example, a seed layer 75 and a metal layer 76. The seed layer 75 coats the upper surface 53A of the insulating layer 53, the inner surface of the through hole VH6 in the gap S1, the upper end surface 65A of the metal layer 65 and the side surface of the metal layer 66, and the upper end surface 66A of the metal layer 66. The seed layer 75 in the present example has a two-layer structure (Ti/Cu) in which, for example, a metal film 77 that may be a titanium (Ti) film and a metal film 78 that may be a copper film are stacked in this order. The metal layer 76 coats the entire upper surface of the metal film 78. The metal films 77 and 78 may be, for example, metal films (sputtered films) formed by a sputtering method. The thickness of the metal film 77 may be, for example, about 20 to 50 nm, and the thickness of the metal film 78 may be, for example, about 100 to 300 nm. The metal film 77 below the seed layer 75 is a metal film that functions as a metallic barrier film by which copper is restrained from diffusing to the insulating layer 53 from the metal film 78 and the metal layer 76 that are arranged thereabove. The material usable for the metal film that functions as a metallic barrier film is not limited to Ti and may be titanium nitride (TiN), tantalum nitride (TaN), tantalum (Ta), chromium (Cr), for example. The material usable for the metal layer 76 may be, for example, copper or a copper alloy.

As illustrated in FIG. 1A, a through hole VH7, which is opened at a predetermined place of the upper surface of the insulating layer 81 and by which a part of the upper surface of the wiring layer 71 (e.g., the pad 71P) is exposed while passing through the insulating layer 81 in the thickness direction, is formed in the insulating layer 81. The through hole VH7 is formed in a tapered manner such that the diameter becomes greater from the lower side (wiring-layer 71 side) toward the upper side (wiring-layer 72 side) in FIG. 1A. For example, the through hole VH7 is formed in a substantially inverted trapezoidal shape as viewed in cross section, and is formed in a substantially circular shape as viewed in plan view. Preferably, for example, insulating resin differing from the insulating layers 51 to 53 formed below the fine wiring structure 70 is used as the material of the insulating layer 81. Preferably, for example, insulating resin that has photosensitivity is used as the material of the insulating layer 81. The material usable for the insulating layer 81 may be, for example, insulating resin, such as phenol resin or polyimide resin.

A via V7 by which the wiring layer 71 and the wiring layer 72 are electrically connected together is formed in the through hole VH7. The via V7 passes through the insulating layer 81 in the thickness direction. The via V7 fills the through hole VH7. The via V7 is formed in a tapered manner such that the diameter becomes greater from the lower side (wiring-layer 71 side) toward the upper side (wiring-layer 72 side) in FIG. 1A in the same way as the through hole VH7. For example, the via V7 is formed in a substantially reverse-truncated cone shape in which the upper surface is greater in diameter than the lower surface. The via V7 is smaller in diameter than, for example, the via 64. The diameter of the upper surface of the via V7 may be, for example, about 10 to 20 µm, and the diameter of the lower surface of the via V7 may be, for example, about 5 to 15 µm.

The wiring layer 72 is stacked on the insulating layer 81 so as to be connected to the upper surface of the via V7. The wiring layer 72 is formed integrally with the via V7. The material usable for the wiring layers 71, 72 and the via V7 may be, for example, copper or a copper alloy.

A through hole VH8, which is opened at a predetermined place of the upper surface of the insulating layer 82 and which passes through the insulating layer 82 in the thickness direction, is formed in the insulating layer 82. A via V8 by which the wiring layer 72 and the wiring layer 73 are electrically connected together is formed in the through hole VH8. The via V8 fills the through hole VH8. A through hole VH9, which is opened at a predetermined place of the upper surface of the insulating layer 83 and which passes through the insulating layer 83 in the thickness direction, is formed in the insulating layer 83. A via V9 by which the wiring layer 73 and the wiring layer 74 are electrically connected together is formed in the through hole VH9. The via V9 fills the through hole VH9. These through holes VH8, VH9 and vias V8, V9 are formed in a tapered manner such that the diameter becomes greater from the lower side (wiring-layer 72 side) toward the upper side (wiring-layer 74 side) in FIG. 1A. For example, the through holes VH8 and VH9 are each formed in a reverse-truncated cone shape in which the opening diameter of an upper opening end is greater than the opening diameter of a lower opening end, and the vias V8 and V9 are each formed in a reverse-truncated cone shape in which the upper surface is greater in diameter than the lower surface.

Herein, the insulating layers 81 to 83 are formed more thinly than the insulating layers 51 to 53 formed below the fine wiring structure 70. For example, the thickness from the upper surface 71A of the wiring layer 71 to the upper surface of the insulating layer 81, the thickness from the upper surface of the wiring layer 72 to the upper surface of the insulating layer 82, and the thickness from the upper surface of the wiring layer 73 to the upper surface of the insulating layer 83 may be, for example, about 1 to 20 µm (suitably, 3 to 5 µm). The material usable for the wiring layers 73 and 74 and the vias V8 and V9 may be, for example, copper or a copper alloy. Preferably, for example, insulating resin differing from the insulating layers 51 to 53 formed below the fine wiring structure 70 is used as the material of the insulating layers 82 and 83 in the same way as the insulating layer 81. Preferably, for example, insulating resin that has photosensitivity is used as the material of the insulating layers 82 and 83. The material usable for the insulating layers 82 and 83 may be, for example, insulating resin, such as phenol resin or polyimide resin.

Next, a structure of the semiconductor device 90 will be described.

Figure 3:
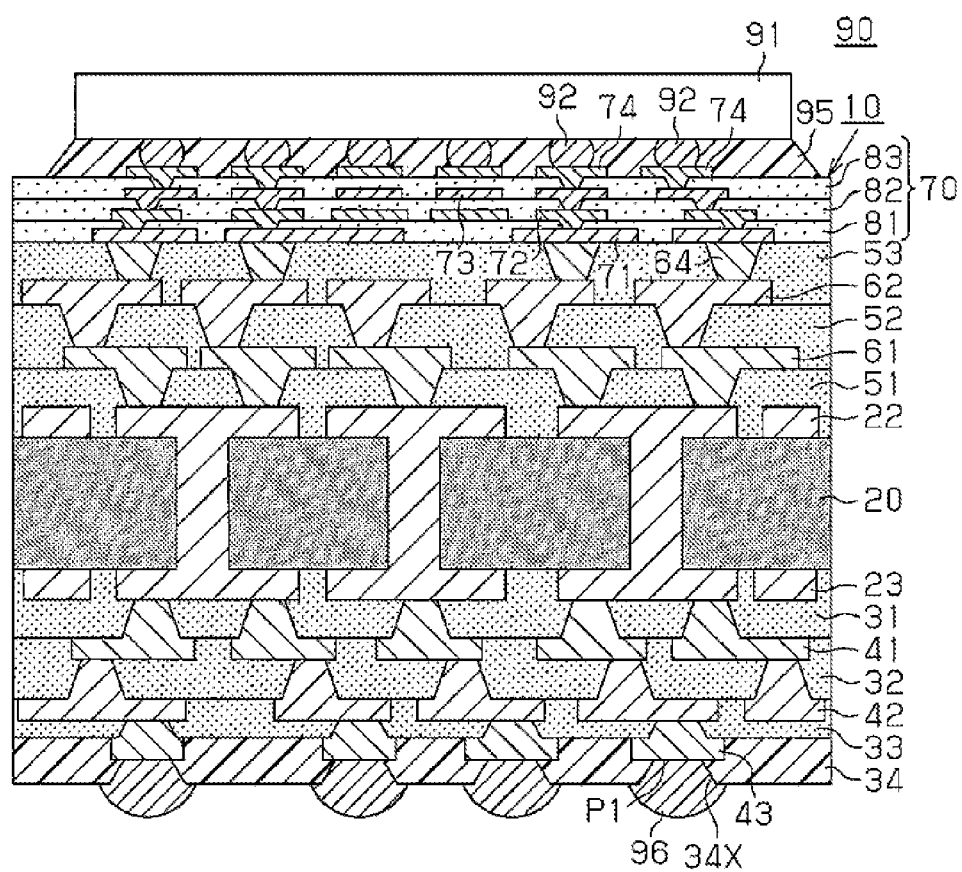
FIG. 3 is a schematic cross-sectional view illustrating a semiconductor device of one embodiment.

As illustrated in FIG. 3, the semiconductor device 90 includes the wiring board 10, one or more semiconductor chips 91, an underfill resin 95, and an external connection terminal 96.

The semiconductor chip 91 is mounted on the wiring board 10 in a flip chip manner. The semiconductor chip 91 is electrically connected to the wiring layer 74 through a bump 92 by bonding the bump 92 arranged on a circuit-forming surface (i.e., lower surface in FIG. 3) of the semiconductor chip 91 to the outermost wiring layer 74 (pad) of the fine wiring structure 70.

The semiconductor chip 91 may be, for example, a logic chip, such as a CPU (Central Processing Unit) chip or a GPU (Graphics Processing Unit) chip. A memory chip, such as a DRAM (Dynamic Random Access Memory) chip, a SRAM (Static Random Access Memory) chip, or a flash memory chip, may also be used as the semiconductor chip 91. If a plurality of semiconductor chips 91 are mounted on the wiring board 10, a combination of the logic chip and the memory chip may be mounted on the wiring board 10. For example, the CPU chip and the DRAM chip may be mounted on the wiring board 10, or the GPU chip and the DRAM chip may be mounted on the wiring board 10.

The size of the semiconductor chip 91 may be, for example, about 3 mm×3 mm to 12 mm×12 mm as viewed in plan view. The thickness of the semiconductor chip 91 may be, for example, about 50 to 100 µm.

The bump 92 may be, for example, a gold bump or a solder bump. The material usable for the solder bump may be, for example, an alloy including lead (Pb), an alloy of tin (Sn) and Au, an alloy of Sn and Cu, an alloy of Sn and silver (Ag), an alloy of Sn, Ag, and Cu.

The underfill resin 95 fills a gap between the wiring board 10 and the semiconductor chip 91. The underfill resin 95 may be, for example, insulating resin such as epoxy resin.

The external connection terminal 96 is formed on the external connection pad P1 of the wiring board 10. The external connection terminal 96 is, for example, a connection terminal that is electrically connected to a pad arranged on a mounting board, such as a mother board (not illustrated). The external connection terminal 96 may be, for example, a solder ball or a lead pin. The external connection terminal 96 may be a solder ball.

Next, the operation of the wiring board 10 and the operation of the semiconductor device 90 will be described.

The upper surface 53A of the insulating layer 53 is a surface smoother than the inner surface of the through hole VH6 of the insulating layer 53. This makes it possible to evenly form a metal film (e.g., a seed layer) on the upper surface 53A of the insulating layer 53 by, for example, the sputtering method. Additionally, the upper surface 53A of the insulating layer 53 is a less-rugged smooth surface, and therefore, in comparison with a case in which the upper surface 53A of the insulating layer 53 is a roughened surface that is greatly rugged, it is possible to restrain residues from being generated when the seed layer is etched and removed.

In the upper part of the inside of the through hole VH6, a gap S1 is formed between the via 64 and the inner surface (i.e., the insulating layer 53) of the through hole VH6, and the wiring layer 71 is formed so as to fill the gap S1 therewith. Herein, the inner surface of the through hole VH6 is a roughened surface, and therefore the adhesion between the wiring layer 71 and the insulating layer 53 is raised by the anchor effect. The wiring layer 71 and the insulating layer 53 adhere to each other more tightly than in a case in which the wiring layer 71 is formed only on the upper surface 53A of the insulating layer 53 that is a smooth surface.

If a gap S1 is formed near an outer peripheral edge of the through hole VH6, the following problems may occur.

Figure 4A:
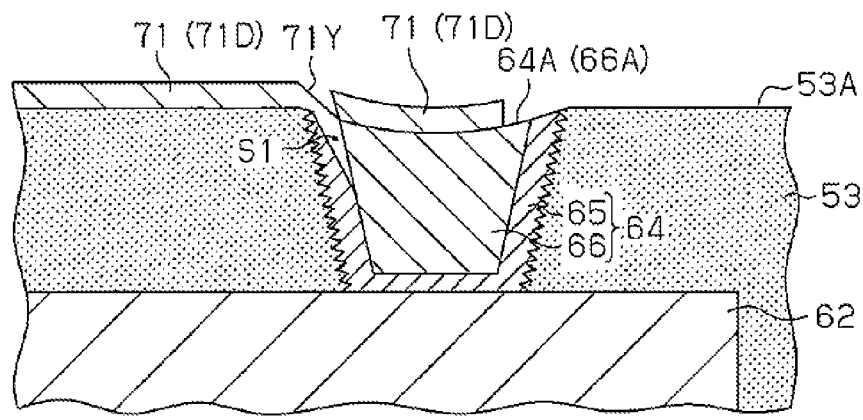
FIGS. 4A, 4B and 4C are descriptive views, each illustrating the problem of a wiring board provided with a gap.
Figure 4B:
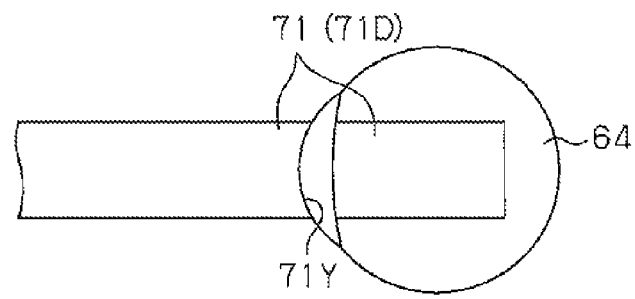

When the gap S1 formed in the through hole VH6 becomes deep as illustrated in FIG. 4A, a groove portion 71Y is also formed in the wiring layer 71 formed on the via 64. At this time, the wiring layer 71 does not include the pad 71P as illustrated in FIG. 4B, and, if the lead wire 71D is connected directly to the upper end surface 64A of the via 64, the groove portion 71Y will be formed in a part of the lead wire 71D, and therefore, disadvantageously, the lead wire 71D may be disconnected therefrom.

Figure 4C:
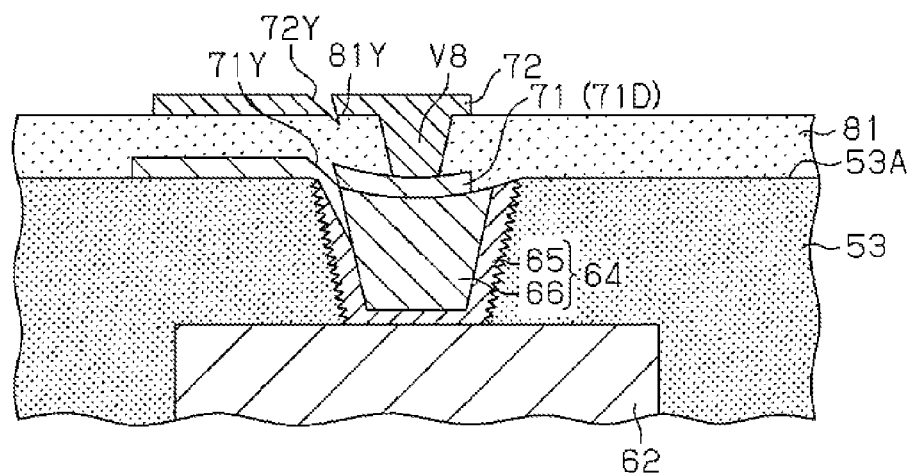

If the groove portion 71Y is generated in the wiring layer 71 as illustrated in FIG. 4C, a groove portion 81Y may also be formed in the insulating layer 81, and, disadvantageously, a groove portion 72Y may also be formed in the wiring layer 72.

On the other hand, in the wiring board 10 of the present embodiment, the wiring layer 71 having the pad 71P, which is greater in diameter than the upper end surface 64A of the via 64 and which is greater in diameter than the through hole VH6, is formed on the upper end surface 64A of the via 64. As a result, the gap S1 is coated with the pad 71P having an area greater than the via 64 and the through hole VH6, and therefore it is possible to restrain the groove portion 71Y from being formed in the pad 71P. Therefore, it is possible to restrain the groove portion 81Y from being formed in the insulating layer 81, and it is possible to restrain the groove portion 72Y from being formed in the wiring layer 72. Even if the groove portion 71Y is formed in the wiring layer 71 (pad 71P) arranged directly on the gap S1, it is possible to suitably restrain the occurrence of a disconnection between the pad 71P and the lead wire 71D because the pad 71P has an area greater than the via 64 and the through hole VH6. It is possible to suitably restrain the occurrence of the groove portion 71Y at the outer peripheral edge of the pad 71P, and therefore it is possible to suitably restrain the occurrence of a disconnection between the pad 71P and the lead wire 71D. In other words, even if a disconnection is partially caused by the groove portion 71Y in the pad 71P arranged directly on the gap S1, no influence is exerted onto a connection between the pad 71P and the lead wire 71D connected to the outer periphery of the pad 71P because disconnection thereof occurs inside the pad 71P. Therefore, even if the gap S1 is formed in the through hole VH6, it is possible to secure an electric connection between the pad 71P and the lead wire 71D.

As illustrated in FIG. 2A, the wiring layer 71 (pad 71P) includes a projection that extends toward the wiring layer 62 to fill the gap S1. The projection may have a hollow conical frustum including an inclined inner surface and an inclined outer surface. The inclined inner surface holds the via 64. The inclined outer surface is bonded to the inner surface of the through hole VH6. The pad 71P includes a central portion extending laterally inward from the projection and bonded to the upper end surface 66A of the metal layer 66 and a flange portion extending laterally outward from the projection and surrounding an opened edge of the through hole VH6 in the surface 53A of the insulating layer 53.

Next, a method for manufacturing the wiring board 10 will be described.

Figure 5A:
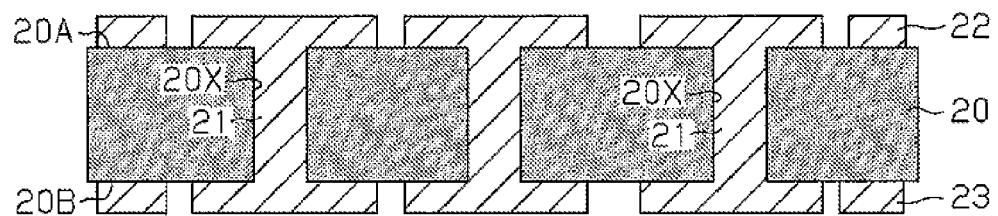
FIGS. 5A, 5B and 5C are schematic cross-sectional views illustrating a method for manufacturing a wiring board of one embodiment.

First, for example, a through hole 20X is formed in a copper-clad laminate (CCL) that serves as the core board 20, and a through electrode 21 is formed in the through hole 20X by an electrolytic plating method or a paste filling method as illustrated in FIG. 5A. Thereafter, a wiring layer 22 is formed on the upper surface 20A of the core board 20 by a subtractive method, and a wiring layer 23 is formed on the lower surface 20B of the core board 20.

Figure 5B:
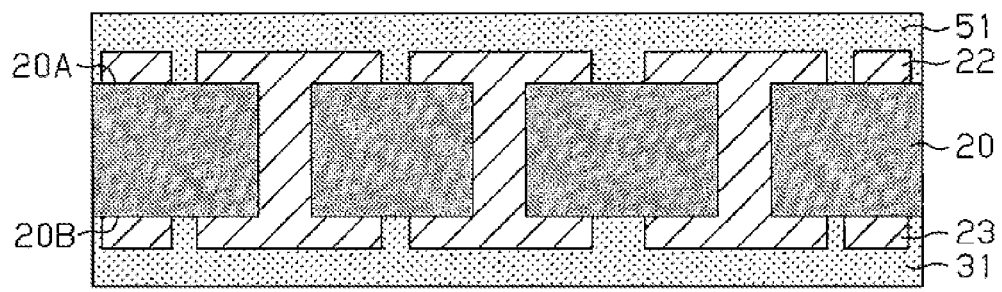

Thereafter, as illustrated in FIG. 5B, an insulating layer 31 with which the lower surface 20B of the core board 20 and the wiring layer 23 are coated is formed, and an insulating layer 51 with which the upper surface 20A of the core board 20 and the wiring layer 22 are coated is formed. It is possible to form these insulating layers 31 and 51, for example, by laminating a resin film onto the core board 20 and then heating and hardening the resin film at a temperature of about 130 to 200° C. while pressing the resin film. The resin film may be, for example, a film of thermosetting resin, such as epoxy resin.

Figure 5C:
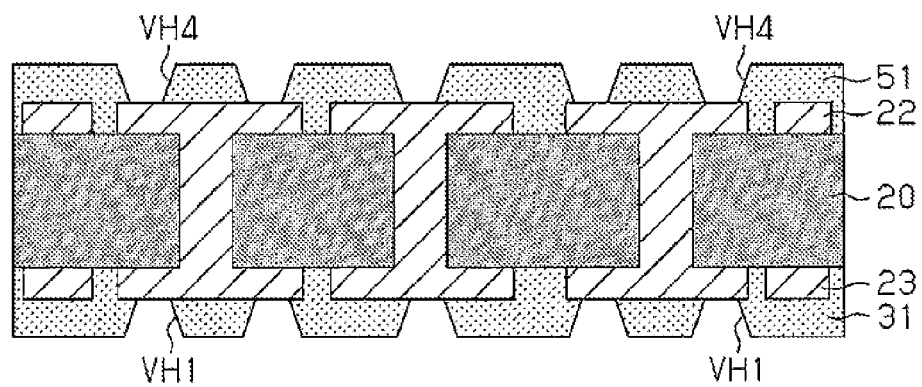

Thereafter, as illustrated in FIG. 5C, a through hole VH1 is formed at a predetermined place of the insulating layer 31 such that a part of the lower surface of the wiring layer 23 is exposed, and a through hole VH4 is formed at a predetermined place of the insulating layer 51 such that a part of the upper surface of the wiring layer 22 is exposed. It is possible to form these through holes VH1 and VH4 by a laser processing method using a $CO_2$ laser, a UV-YAG laser, for example. If the insulating layers 31 and 51 are formed by use of photosensitive resin, the predetermined through holes VH1 and VH4 may be formed by, for example, a photolithography method.

Thereafter, when the through holes VH1 and VH4 are formed by the laser processing method, desmearing is performed to remove a resin smear adhering to the exposed surfaces of the wiring layers 22 and 23 exposed to the bottoms of the through holes VH1 and VH4.

Figure 6A:
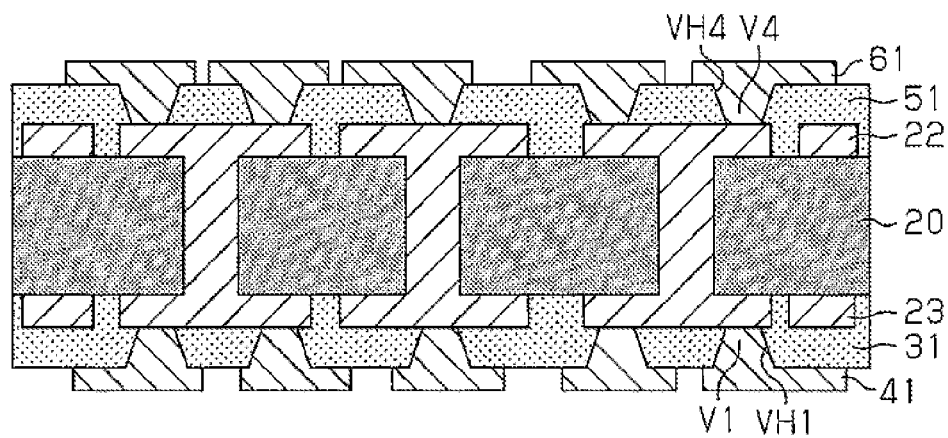
FIGS. 6A and 6B are schematic cross-sectional views illustrating a method for manufacturing a wiring board of one embodiment.

Thereafter, as illustrated in FIG. 6A, a via V1 is formed in the through hole VH1 of the insulating layer 31, and the wiring layer 41 electrically connected to the wiring layer 23 through the via V1 is stacked on the lower surface of the insulating layer 31. A via V4 is formed in the through hole VH4 of the insulating layer 51, and the wiring layer 61 electrically connected to the wiring layer 22 through the via V4 is stacked on the upper surface of the insulating layer 51. It is possible to form these vias V1, V4 and wiring layers 41, 61 by use of various wiring-forming methods, such as the semi-additive method or the subtractive method. These vias V1, V4 and wiring layers 41, 61 are formed by, for example, a plating metal made of copper or a copper alloy according to the wiring-forming method.

Figure 6B:
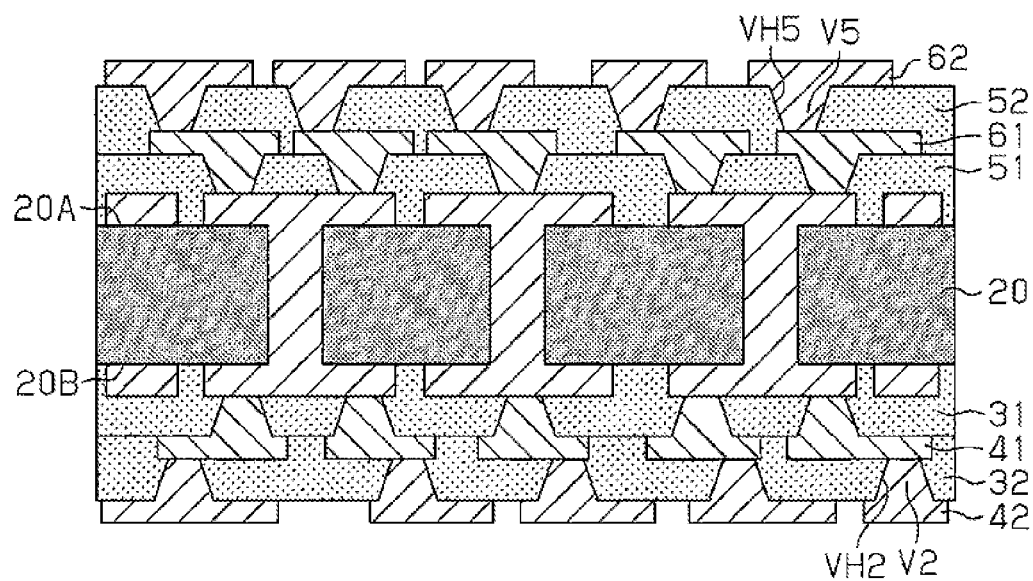

Thereafter, the same steps as in FIGS. 5B to 6A are again performed, and, as a result, as illustrated in FIG. 6B, the insulating layer 32 and the wiring layer 42 are stacked on the side of the lower surface 20B of the core board 20, and the insulating layer 52 and the wiring layer 62 are stacked on the side of the upper surface 20A of the core board 20.

Figure 7A:
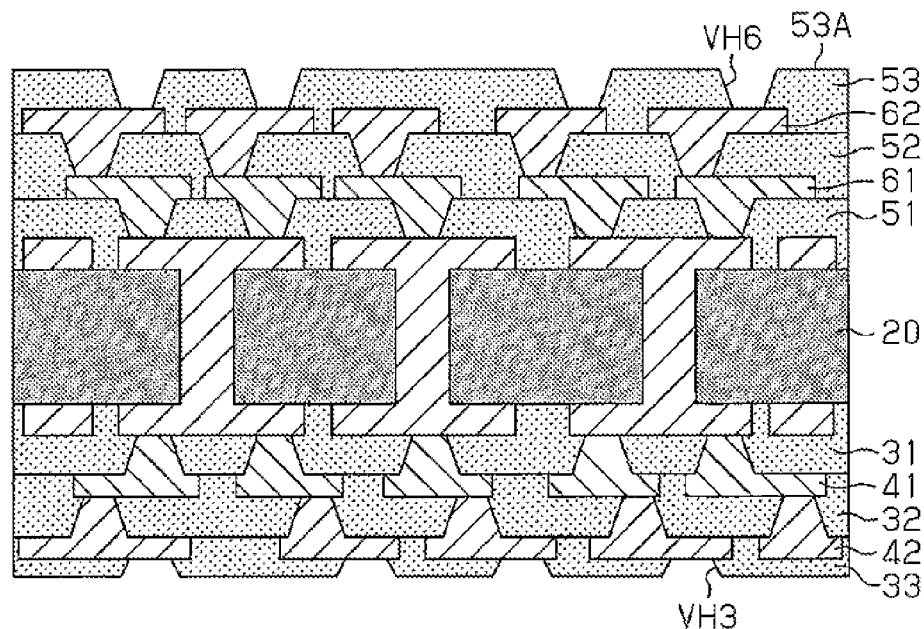
FIGS. 7A and 7B are schematic cross-sectional views illustrating a method for manufacturing a wiring board of one embodiment.

Thereafter, the same steps as in FIGS. 5B and 5C are again performed, and, as a result, as illustrated in FIG. 7A, the insulating layer 33 having the through hole VH3 is stacked on the lower surface of the insulating layer 32, and the insulating layer 53 having the through hole VH6 is stacked on the upper surface of the insulating layer 52.

Thereafter, when the through holes VH3 and VH6 are formed by the laser processing method, desmearing is performed to remove a resin smear adhering to the exposed surfaces of the wiring layers 42 and 62 exposed to the bottoms of the through holes VH3 and VH6. The desmearing operation makes it possible to roughen the inner surface of the through hole VH6 and the upper surface 53A of the insulating layer 53, and makes it possible to roughen the inner surface of the through hole VH3 and the lower surface of the insulating layer 33.

Figure 7B:
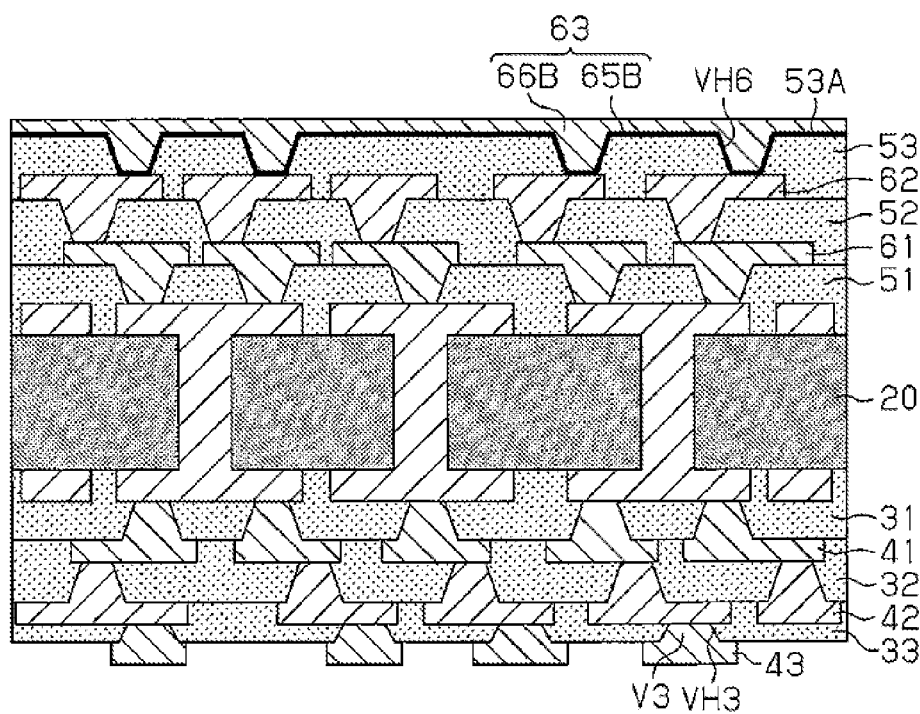

Thereafter, as illustrated in FIG. 7B, a via V3 is formed in the through hole VH3 of the insulating layer 33, and the wiring layer 43 electrically connected to the wiring layer 42 through the via V3 is stacked on the lower surface of the insulating layer 33. It is possible to form these via V3 and wiring layer 43 by use of various wiring-forming methods, such as the semi-additive method or the subtractive method.

As illustrated in FIG. 7B, a seed layer 65B with which the entire surface of the insulating layer 53 including the inner surface of the through hole VH6 is coated is formed. Electrolytic plating (panel plating) is applied while using the seed layer 65B as an electric supply layer. For example, the seed layer 65B with which the entire surface of the insulating layer 53 is coated is formed by an electroless copper plating method, and electrolytic copper plating is applied while using the seed layer 65B as an electric supply layer, and a metal layer 66B is formed. As a result, the through hole VH6 is filled therewith, and a conductive layer 63 (i.e., the seed layer 65B and the metal layer 66B) with which the entire upper surface 53A of the insulating layer 53 is coated is formed. In the electroless copper plating method, for example, in order to improve the depositional properties and the adhesive properties of an electroless copper plating film with respect to the surface of the insulating layer 53, a palladium catalyst is given to the entire surface of the insulating layer 53, and then electroless copper plating is applied onto the entire surface of the insulating layer 53, and a seed layer 65B is formed.

Figure 8A:
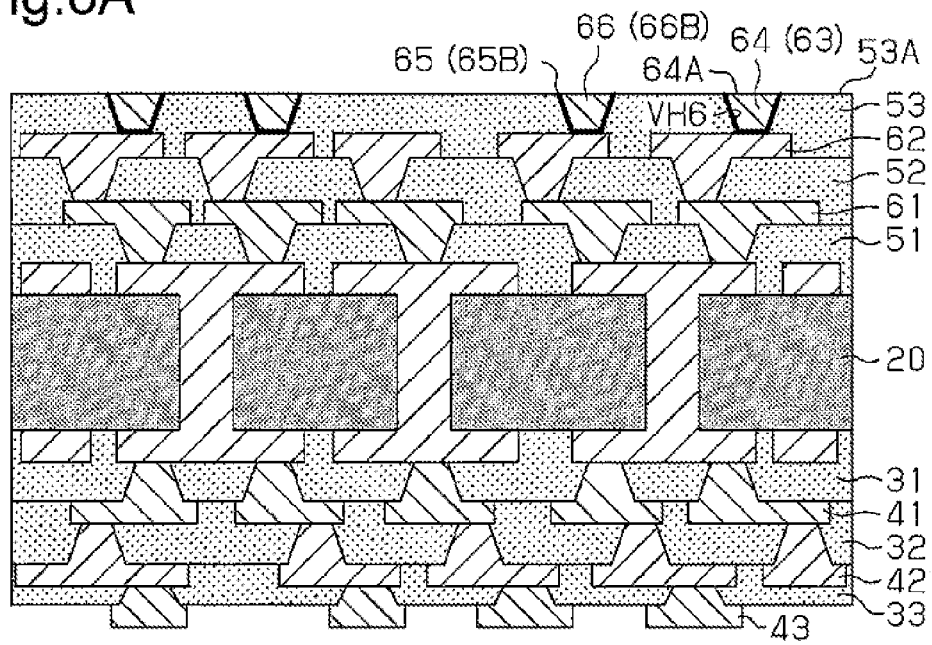
FIG. 8A is a schematic cross-sectional view illustrating a method for manufacturing a wiring board of one embodiment.
Figure 8B:
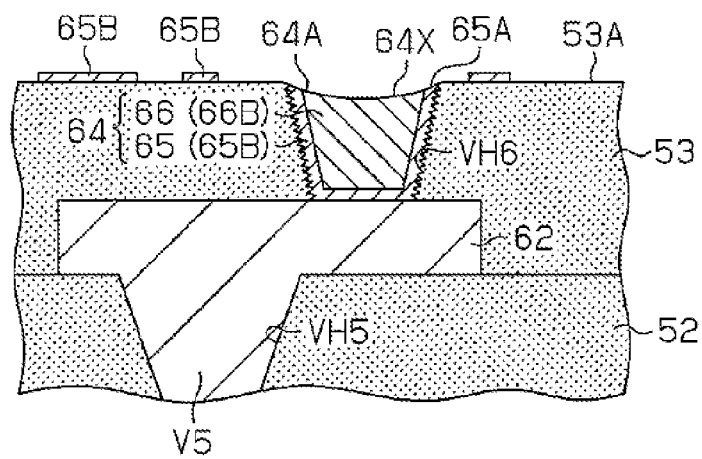
FIG. 8B is an enlarged cross-sectional view in which a part of a structure illustrated in FIG. 8A is enlarged.

Thereafter, as illustrated in FIG. 8A, according to, for example, the chemical mechanical polishing (CMP) method, the conductive layer 63 (the metal layer 66B and the seed layer 65B) protruding from the upper surface 53A of the insulating layer 53 is ground, and the upper surface 53A of the insulating layer 53 that is a roughened surface is ground. As a result, as illustrated in FIG. 8B, a metal layer 65 with which the entire inner surface of the through hole VH6 is coated is formed in the through hole VH6, and a metal layer 66 is formed in the through hole VH6 inside the metal layer 65. A via 64 made of these metal layers 65 and 66 is formed. Furthermore, the upper surface 53A of the insulating layer 53 is smoothed. At this time, the inner surface of the through hole VH6 is still in a roughened state, and therefore the upper surface 53A of the insulating layer 53 has surface roughness lower than that of the inner surface of the through hole VH6. Here, at the grinding step of FIG. 8A, the upper surface 53A of the insulating layer 53, the seed layer 65B, and the metal layer 66B are ground until the upper surface 53A of the insulating layer 53 is smoothed (for example, until it becomes 0.2 μm or less in the surface roughness (Ra) value). At this time, in the CMP method of this step, a difference is generated between the amount of grinding of the conductive layer 63 (the seed layer 65B and the metal layer 66B) and the amount of grinding of the insulating layer 53. For example, the quality of material of slurry and the hardness of a grinding pad are adjusted so that the amount of grinding of the conductive layer 63 is greater than the amount of grinding of the insulating layer 53. As illustrated in FIG. 8B, when the upper surface 53A of the insulating layer 53 is ground to be smoothed, the amount of grinding of the conductive layer 63 becomes greater than that of the insulating layer 53, and a concave portion 64X is formed in the upper end surface 64A of the via 64.

Figure 8C:
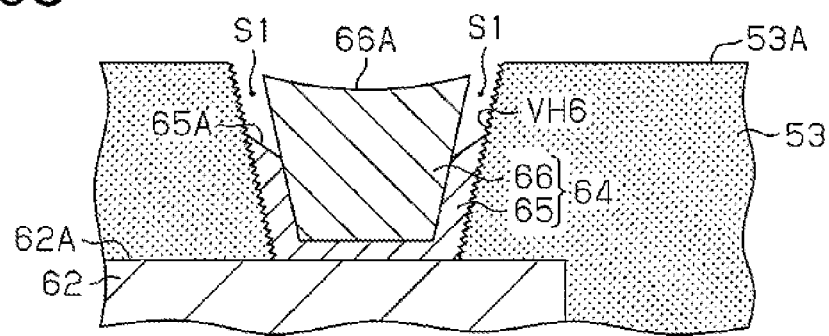
FIG. 8C is an enlarged cross-sectional view illustrating the method for manufacturing a wiring board of one embodiment.

Thereafter, as illustrated in FIG. 8C, a gap S1 is formed in the through hole VH6. For example, a part of the metal layer 65 is selectively etched and removed with respect to the metal layer 66 and the insulating layer 53. More specifically, a part closer to the upper end surface 65A of the metal layer 65 with which the inner surface of the through hole VH6 is coated is etched and removed. As a result, a part of the metal layer 65 is removed, and the upper end surface 65A of the metal layer 65 becomes lower than the upper surface 53A of the insulating layer 53, and a gap S1 is formed near the outer peripheral edge of the through hole VH6. An etchant used in this process may be, for example, a liquid in which an azole compound is added to a hydrogen peroxide-sulfuric acid-based etchant. The etchant serves to selectively etch the metal layer 65 that may be an electroless copper plating layer without etching the metal layer 66 that may be an electrolytic copper plating layer while making a difference in the etching speed between the electrolytic copper plating layer and the electroless copper plating layer. However, there is a case in which a part of the metal layer 66 is melted and removed even if an etchant is used. If so, the upper end surface 66A of the metal layer 66 may be formed at a lower position than the upper surface 53A of the insulating layer 53 as illustrated in FIG. 8C. The etching operation is performed, and, as a result, even when a part of the seed layer 65B (see FIG. 8B) remains on the upper surface 53A of the insulating layer 53 after ending the CMP process, it is possible to remove the remaining seed layer 65B.

As described below, in the process illustrated in FIGS. 9A to 14A, a fine wiring structure 70 is formed on the insulating layer 53, and therefore a structure closer to the lower surface 20B of the core board 20 is not illustrated in FIGS. 9A to 14A.

Figure 9A:
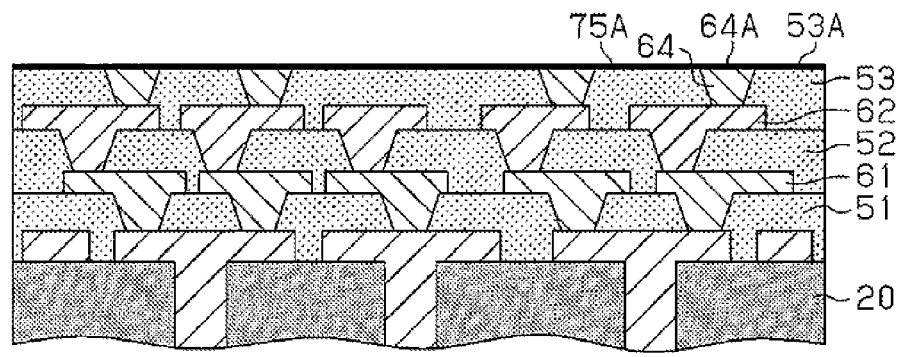
FIG. 9A is a schematic cross-sectional view illustrating a method for manufacturing a wiring board of one embodiment.
Figure 9B:
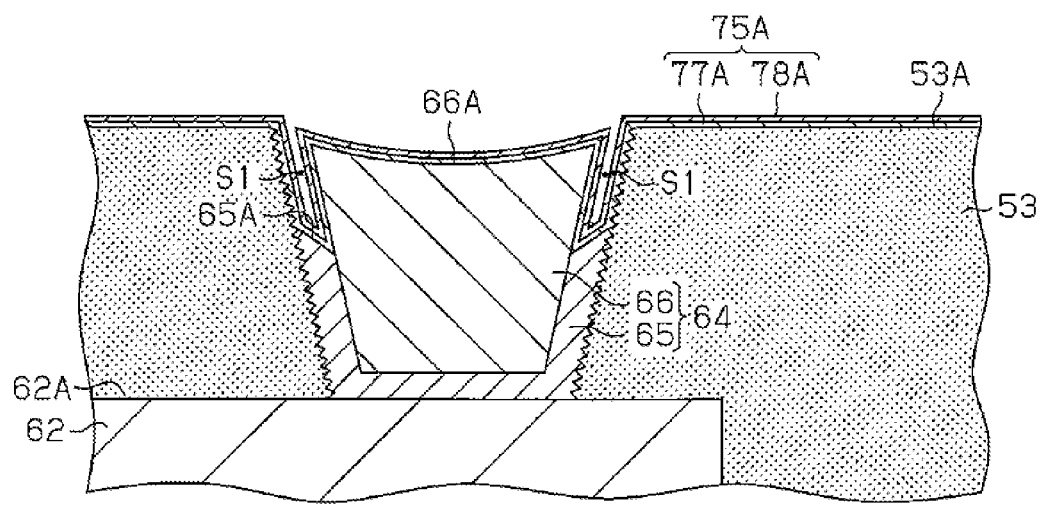
FIG. 9B is an enlarged cross-sectional view in which a part of a structure illustrated in FIG. 9A is enlarged.

Thereafter, as illustrated in FIG. 9A, a seed layer 75A is formed so as to coat the entire surface closer to the upper surface of the core board 20 therewith. More specifically, as illustrated in FIG. 9B, a seed layer 75A is formed so as to coat the upper surface 53A of the insulating layer 53, the upper end surface 66A of the metal layer 66, the upper end surface 65A of the metal layer 65, and the side surface of the metal layer 66 and the inner surface of the through hole VH6 exposed from the metal layer 65. It is possible to form the seed layer 75A by, for example, the sputtering method or the electroless plating method. For example, in this process, the upper surface 53A of the insulating layer 53 is a smooth surface, and therefore it is possible to evenly form the seed layer 75A by the sputtering method with respect to the upper surface 53A, and it is possible to smoothly form the upper surface of the seed layer 75A. Therefore, it is possible to form the seed layer 75A more thinly than in a case in which the seed layer 75A is formed by the sputtering method with respect to a roughened surface. For example, when the seed layer 75A is formed by the sputtering method, first, titanium is deposited on the upper surface 53A of the insulating layer 53, on the upper end surface 66A of the metal layer 66, on the upper end surface 65A of the metal layer 65, and on the side surface of the metal layer 66 and the inner surface of the through hole VH6 exposed from the metal layer 65 so as to cover these surfaces according to the sputtering method, and, as a result, a metal film 77A is formed. Thereafter, copper is deposited on the metal film 77A by sputtering, and a metal film 78A is formed. This makes it possible to form a seed layer 75A having a two-layer structure (Ti layer/Cu layer). When the seed layer 75A is formed by the electroless plating method, it is possible to form a seed layer 75A having a single-layer structure (Cu layer) by, for example, the electroless copper plating method.

Figure 10A:
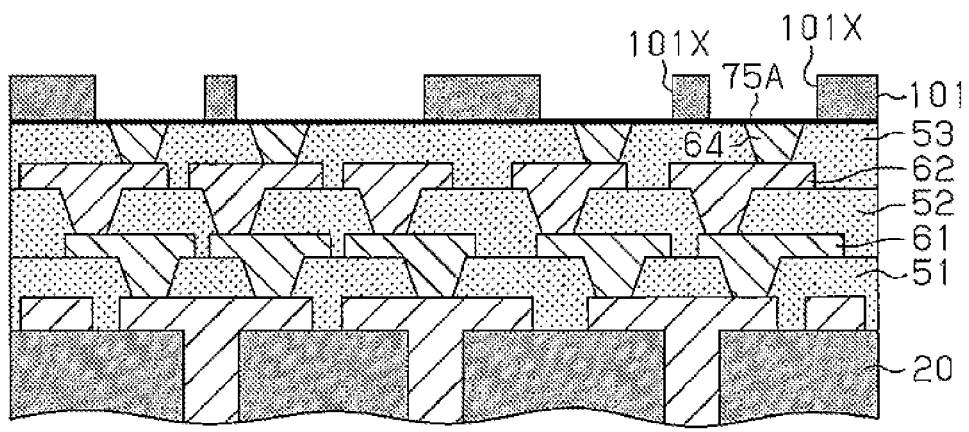
FIGS. 10A and 10B are schematic cross-sectional views illustrating a method for manufacturing a wiring board of one embodiment.

Thereafter, as illustrated in FIG. 10A, a resist layer 101 that has an opening pattern 101X at a predetermined place is formed on the seed layer 75A. The opening pattern 101X is formed so as to expose the seed layer 75A of a part corresponding to a formation region of the wiring layer 71 (see FIG. 1). The material usable for the resist layer 101 may be, for example, a material having plating-resisting properties with respect to the plating process of a subsequent step. The material usable for the resist layer 101 may be, for example, a photosensitive dry film resist or a liquid photoresist (for example, dry film resist or liquid resist of novolac-based resin or acrylic resin). For example, when a photosensitive dry film resist is used, a dry film is laminated onto the upper surface of the seed layer 75A by thermocompression bonding, and the resist layer 101 that has the opening pattern 101X is formed by applying patterning onto the dry film according to the photolithography method. Likewise, when a liquid photoresist is used, it is possible to form the resist layer 101 through the same process. In this process, the upper surface of the seed layer 75A on which the resist layer 101 is formed is a smooth surface, and therefore it is possible to restrain the occurrence of patterning defects in the resist layer 101. It is possible to form the opening pattern 101X in the resist layer 101 with high accuracy.

Figure 10B:
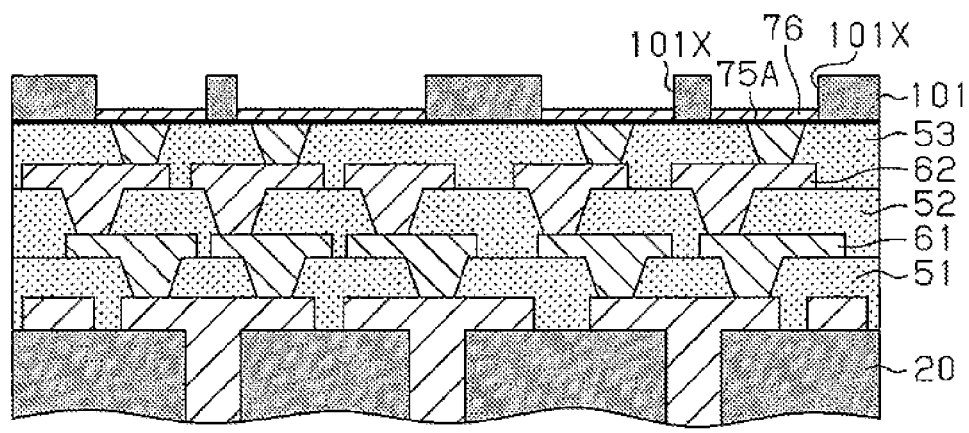

Thereafter, as illustrated in FIG. 10B, the electrolytic plating method that uses the seed layer 75A as a plating-electric-supply layer is applied onto the upper surface of the seed layer 75A while using the resist layer 101 as a plating mask. More specifically, the electrolytic plating method (herein, the electrolytic copper plating method) is applied onto the upper surface of the seed layer 75A exposed from the opening pattern 101X of the resist layer 101, and, as a result, a metal layer 76 (an electrolytic plating layer) is formed on the upper surface of the seed layer 75A. Thereafter, the resist layer 101 is removed by, for example, an alkaline peel-off liquid.

Figure 11A:
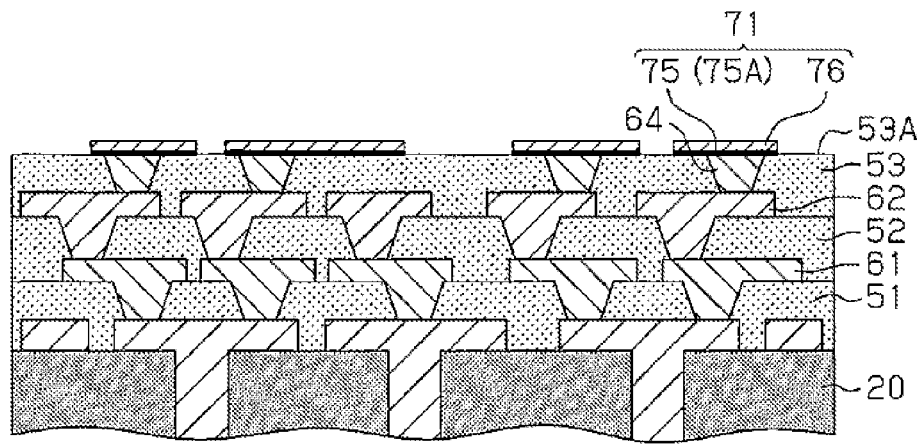
FIG. 11A is a schematic cross-sectional view illustrating a method for manufacturing a wiring board of one embodiment.
Figure 11B:
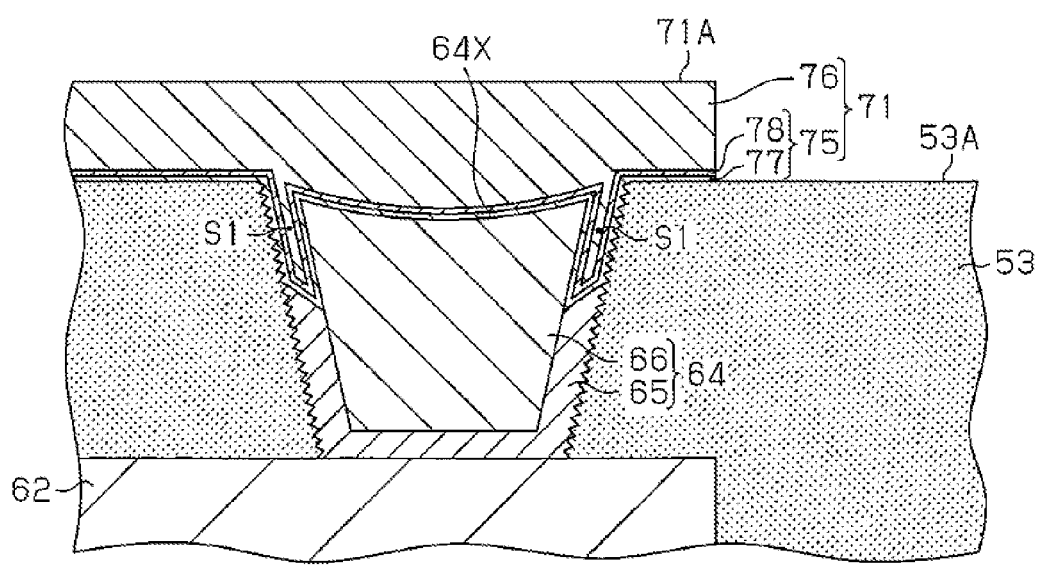
FIG. 11B is an enlarged cross-sectional view in which a part of a structure illustrated in FIG. 11A is enlarged.

Thereafter, as illustrated in FIG. 11A, an unnecessary seed layer 75A is removed by etching while using the metal layer 76 as an etching mask. As a result, as illustrated in FIG. 11B, the wiring layer 71 including the seed layer 75 made of the metal films 77 and 78 and the metal layer 76 is formed on the insulating layer 53. At this time, the wiring layer 71 is formed so as to fill the concave portion 64X of the via 64 and the gap S1 with the seed layer 75 (the metal films 77 and 78) and with the metal layer 76, and the upper surface 71A is flattened. The wiring layer 71 that is finer than the wiring layers 61, 62 arranged therebelow is formed by the semi-additive method in this way.

Figure 12A:
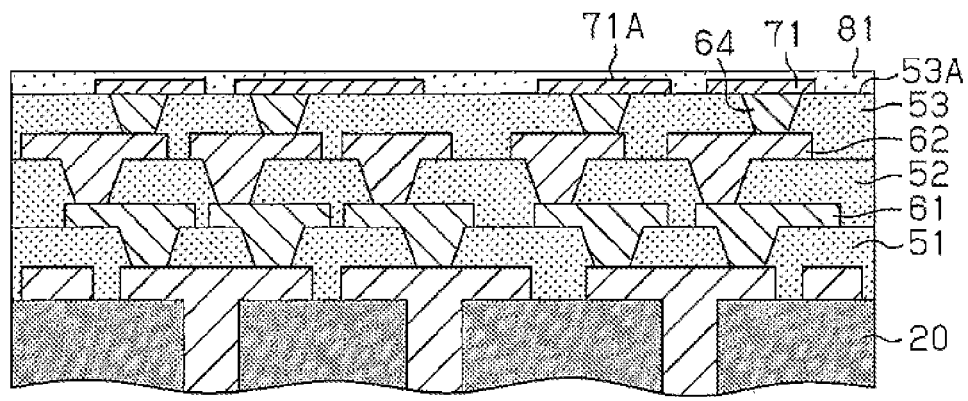
FIGS. 12A and 12B are schematic cross-sectional views illustrating a method for manufacturing a wiring board of one embodiment.

Thereafter, as illustrated in FIG. 12A, an insulating layer 81 with which the entire surface (the upper surface 71A and the side surface) of the wiring layer 71 is coated is formed on the upper surface 53A of the insulating layer 53. For example, the insulating layer 81 is formed by laminating a resin film onto the upper surface 53A of the insulating layer 53 by thermocompression bonding. The resin film may be, for example, a film of photosensitive resin, such as phenol resin or polyimide resin. For example, it is also possible to form the insulating layer 81 by applying a liquid resin onto the upper surface 53A of the insulating layer 53. The liquid resin may be photosensitive resin, such as phenol resin or polyimide resin.

Figure 12B:
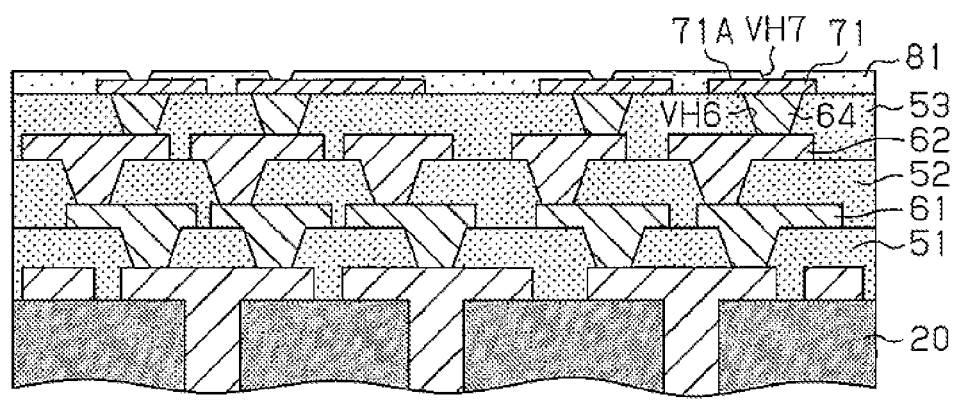

Thereafter, as illustrated in FIG. 12B, a through hole VH7 that exposes a part of the upper surface 71A of the wiring layer 71 is formed at a predetermined place of the insulating layer 81 by, for example, the photolithography method. In this process, the upper surface 71A of the wiring layer 71 is a flat surface, and therefore it is possible to form the through hole VH7 in the insulating layer 81 with high accuracy according to the photolithography method.

Figure 13A:
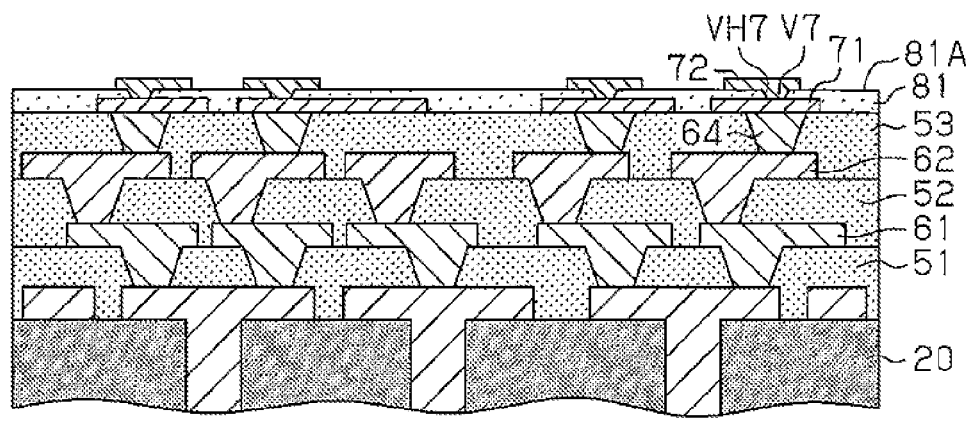
FIG. 13A is a schematic cross-sectional view illustrating a method for manufacturing a wiring board of one embodiment.
Figure 13B:
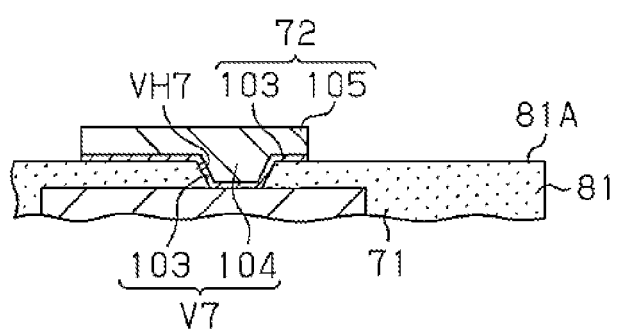
FIG. 13B is an enlarged cross-sectional view in which a part of a structure illustrated in FIG. 13A is enlarged.

Thereafter, as illustrated in FIG. 13A, a via V7 with which the through hole VH7 is filled is formed, and a wiring layer 72 is formed on the insulating layer 81. One example of a method for forming these via V7 and wiring layer 72 will be hereinafter described with reference to FIG. 13B.

First, a seed layer 103 with which the entire upper surface 81A of the insulating layer 81 including the inner surface of the through hole VH7 is coated is formed by the sputtering method or the electroless plating method. For example, when the seed layer 103 is formed by the sputtering method, first, titanium is deposited on the upper surface 81A of the insulating layer 81 so as to cover the entire upper surface 81A of the insulating layer 81 including the inner surface of the through hole VH7 according to the sputtering method, and, as a result, a Ti layer is formed. Thereafter, copper is deposited on the Ti layer by sputtering, and a Cu layer is formed. This makes it possible to form a seed layer 103 having a two-layer structure (Ti layer/Cu layer). At this time, the thickness of the Ti layer may be, for example, about 20 to 50 nm, and the thickness of the Cu layer may be, for example, about 100 to 300 nm. A seed layer 103 having a two-layer structure made of a TiN layer and a Cu layer may be formed by changing the Ti layer into the titanium nitride (TiN) layer. When the seed layer 103 is formed by the electroless plating method, it is possible to form a seed layer 103 having a single-layer structure (Cu layer) by, for example, the electroless copper plating method.

Thereafter, a resist layer (not illustrated) that includes an opening portion corresponding to the wiring layer 72 is formed on the seed layer 103. Thereafter, the electrolytic plating method (e.g., electrolytic copper plating method) that uses the seed layer 103 as a plating-electric-supply layer is applied. As a result, an electrolytic copper plating layer 104 with which the through hole VH7 is filled is formed, and an electrolytic copper plating layer 105 is formed on the electrolytic copper plating layer 104 and on the seed layer 103 exposed from the opening portion of the resist layer. Thereafter, the resist layer is removed, and then an unnecessary seed layer 103 is etched and removed while using the electrolytic copper plating layer 105 as a mask. As a result, a via V7 that includes the seed layer 103 formed in the through hole VH7 and the electrolytic copper plating layer 104 is formed, and a wiring layer 72 that includes the seed layer 103 formed on the upper surface 81A of the insulating layer 81 and the electrolytic copper plating layer 105 is formed. It is possible to form the via V7 and the wiring layer 72 according to, for example, the semi-additive method in this way.

Figure 13C:
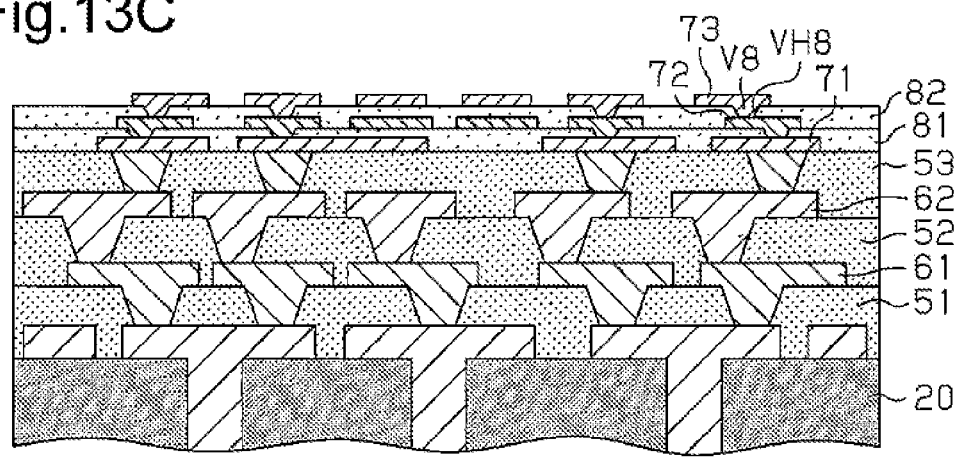
FIG. 13C is a schematic cross-sectional view illustrating a method for manufacturing a wiring board of one embodiment.

Thereafter, as illustrated in FIG. 13C, an insulating layer 82 having the through hole VH8 that exposes a part of the upper surface of the wiring layer 72 is formed on the insulating layer 81 in the same way as in FIGS. 12A and 12B. Thereafter, a via V8 with which the through hole VH8 is filled is formed by, for example, the semi-additive method, and a wiring layer 73 is formed on the insulating layer 82 in the same way as in FIG. 13A.

Figure 14A:
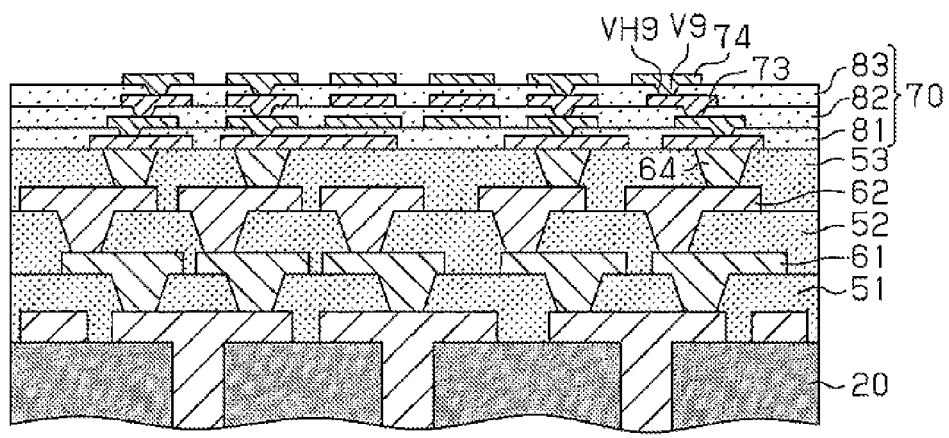
FIGS. 14A and 14B are schematic cross-sectional views illustrating a method for manufacturing a wiring board of one embodiment.

Thereafter, as illustrated in FIG. 14A, an insulating layer 83 having the through hole VH9 that exposes a part of the upper surface of the wiring layer 73 is formed on the insulating layer 82 in the same way as in FIGS. 12A and 12B. Thereafter, a via V9 with which the through hole VH9 is filled is formed by, for example, the semi-additive method, and an uppermost wiring layer 74 is formed on the insulating layer 83 in the same way as in FIG. 13A.

Figure 14B:
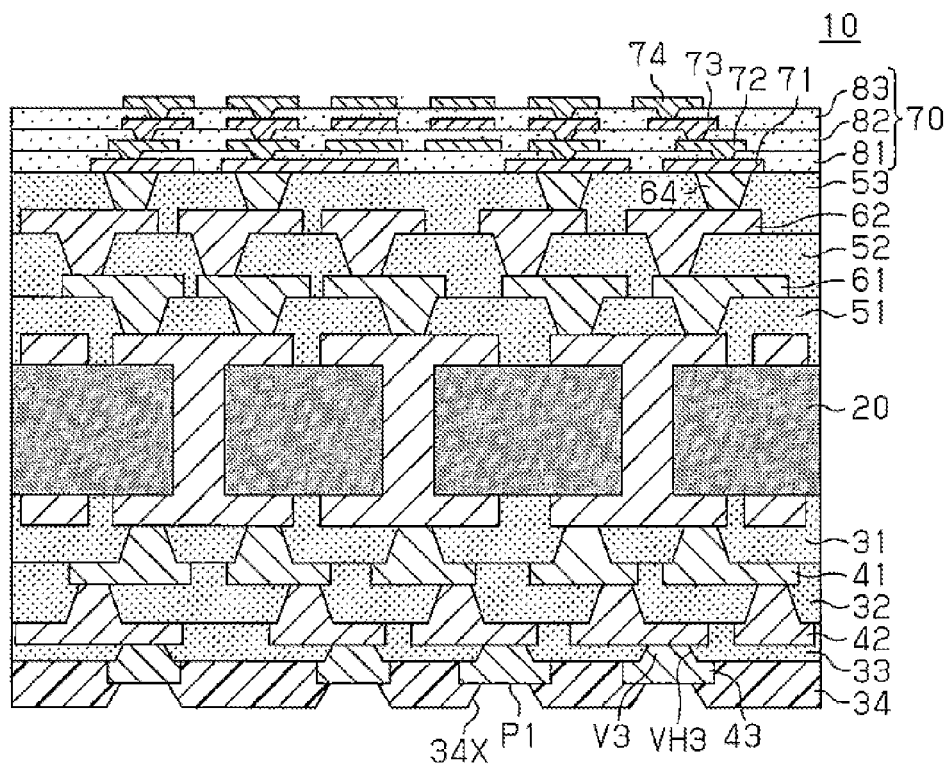

Thereafter, as illustrated in FIG. 14B, a solder resist layer 34 that includes the opening portion 34X to expose the external connection pad P1 defined at a predetermined place of the lowermost wiring layer 43 is stacked on the lower surface of the insulating layer 33. It is possible to form the solder resist layer 34, for example, by laminating a photosensitive solder resist film or applying a liquid solder resist and by patterning the resist into a predetermined shape. As a result, a part of the wiring layer 43 is exposed from the opening portion 34X of the solder resist layer 34 as an external connection pad P1. If needed, for example, an Ni layer and an Au layer may be stacked in this order on the wiring layer 43 (i.e., the external connection pad P1) exposed from the opening portion 34X of the solder resist layer 34. It is possible to form these Ni layer and Au layer by, for example, the electroless plating method.

It is possible to manufacture the wiring board 10 illustrated in FIG. 1 through the aforementioned manufacturing process.

Next, a method for manufacturing the semiconductor device 90 will be described.

Figure 15:
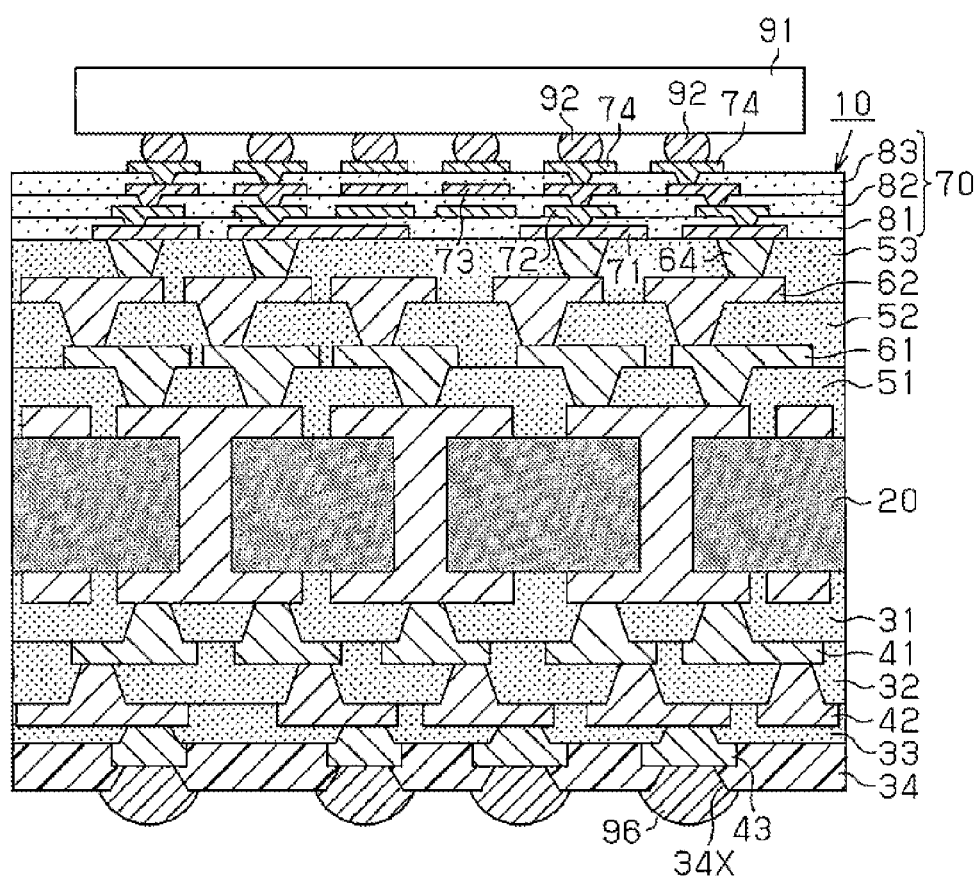
FIG. 15 is a schematic cross-sectional view illustrating a method for manufacturing a semiconductor device of one embodiment.

As illustrated in FIG. 15, an external connection terminal 96 is formed on the external connection pad P1. For example, flux is appropriately applied onto the external connection pad P1, and then the external connection terminal 96 (herein, solder ball) is mounted and fixed while performing reflow at a temperature of about 240 to 260° C. Thereafter, the surface is cleaned to remove the flux.

As illustrated in FIG. 15, a semiconductor chip 91 is mounted on the wiring board 10. More specifically, the bump 92 of the semiconductor chip 91 is bonded onto the wiring layer 74 (pad) of the wiring board 10 in a flip chip manner. Thereafter, the space between the semiconductor chip 91 and the wiring board 10 bonded together in the flip chip manner is filled with the underfill resin 95 (see FIG. 3), and the underfill resin 95 is hardened. It is possible to manufacture the semiconductor device 90 illustrated in FIG. 3 through the aforementioned manufacturing process.

The advantages of the above embodiment will now be described.

(1) As described above, the upper surface 53A of the insulating layer 53 is smoother than the inner surface of the through hole VH6 of the insulating layer 53. Therefore, it is possible to evenly form the metal film (e.g., the seed layer 75A) on the upper surface 53A of the insulating layer 53 by, for example, the sputtering method. Therefore, it is possible to form the seed layer 75A more thinly than in a case in which the seed layer 75A is formed on a roughened surface. Additionally, the upper surface 53A of the insulating layer 53 is a less-rugged smooth surface, and therefore it is possible to restrain residues from being generated when the seed layer is etched and removed in comparison with a case in which the upper surface 53A of the insulating layer 53 is a greatly-rugged roughened surface. These make it possible to easily deal with the miniaturization of the wiring layer even if the wiring layer stacked on the upper surface 53A of the insulating layer 53 has been increasingly miniaturized.

As described above, the gap S1 is formed between the via 64 and the inner surface (the insulating layer 53) of the through hole VH6 in the upper part of the inside of the through hole VH6, and the wiring layer 71 is formed so as to fill the gap S1. Herein, the inner surface of the through hole VH6 is a roughened surface, and therefore it is possible to improve the adhesive properties between the wiring layer 71 and the insulating layer 53 by the anchor effect. It is possible to make the adhesive properties between the wiring layer 71 and the insulating layer 53 higher than in a case in which the wiring layer 71 is formed only on the upper surface 53A of the insulating layer 53 that is a smooth surface.

(2) As described above, the wiring layer 71 having the pad 71P that is greater in diameter than the upper end surface 64A of the via 64 and that is greater in diameter than the through hole VH6 is formed on the upper end surface 64A of the via 64. As a result, the gap S1 is coated with the pad 71P having an area larger than the via 64 and the through hole VH6, and therefore it is possible to restrain the groove portion 71Y from being formed in the pad 71P. Additionally, it is possible to suitably restrain a disconnection from occurring in the lead wire 71D.

(3) As described above, the wiring layer 71 that is connected to the via 64 by filling the concave portion 64X of the via 64 and that includes the upper surface 71A formed more flatly than the upper end surface 64A of the via 64 (the upper end surface 66A of the metal layer 66) is formed on the via 64. Therefore, it is possible to further improve the reliability of a connection between the via V7 and the wiring layer 71 (via 64) than in a case in which the via V7 is connected directly to the upper end surface 64A of the via 64.

(4) As described above, the insulating layer 81 with which the wiring layer 71 whose upper surface 71A is a flat surface is coated is formed, and the through hole VH7 is formed in the insulating layer 81 by the photolithography method. The upper surface 71A of the wiring layer 71 on which the insulating layer 81 is formed is a flat surface, and therefore it is possible to form the small-diameter through hole VH7 in the insulating layer 81 with high accuracy according to the photolithography method.

(5) As described above, the inner surface of the through hole VH6 arranged in the insulating layer 53 is a roughened surface. This makes it possible to make a contact area between the via 64 and the insulating layer 53 greater than in a case in which the inner surface of the through hole VH6 is a smooth surface. Therefore, the adhesive properties between the via 64 and the insulating layer 53 are improved, and become stronger against a tensile force resulting from a difference in the linear expansion coefficient between the via 64 and the insulating layer 53. Therefore, it is possible to improve the reliability of a connection between the via 64 and the insulating layer 53, and it is possible to restrain the via 64 from slipping off from the through hole VH6.

It should be apparent to those skilled in the art that the present invention may be embodied in many other specific forms without departing from the scope of claims. For example, the embodiment may be appropriately modified in the following modes.

As described above, in the embodiment, the gap S1 is formed along the overall periphery of the outer peripheral edge of the through hole VH6. Without being limited to this, for example, the gap S1 may be formed only at a part of the outer peripheral edge of the through hole VH6, or the gap S1 may be formed discontinuously at the outer peripheral edge of the through hole VH6.

As described above, in the embodiment, the upper surface 71A of the wiring layer 71 is formed such that the entire upper surface 71A is parallel to the upper surface 53A of the insulating layer 53, and yet the shape of the upper surface 71A of the wiring layer 71 is not limited to this.

Figure 16:
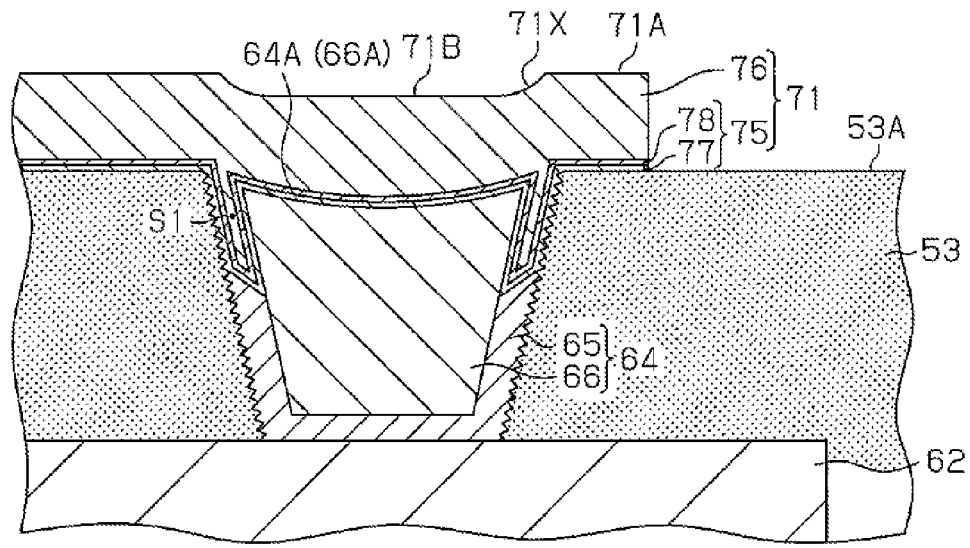
FIG. 16 is an enlarged cross-sectional view in which a part of a wiring board of a modification is enlarged.

For example, a concave portion 71X recessed toward the wiring layer 62 may be formed on the upper surface 71A of the wiring layer 71 if a surface 71B of a part connected to the via V7 of the upper surface 71A of the wiring layer 71 is flatter than the upper end surface 64A of the via 64 as illustrated in FIG. 16. If the upper surface (i.e., the surface 71B) of the wiring layer 71 of a part connected to the via V7 is flatter than the upper end surface 64A of the via 64 (the upper end surface 66A of the metal layer 66), the same effects as the effects (3) and (4) of the embodiment may be fulfilled.

Figure 17:
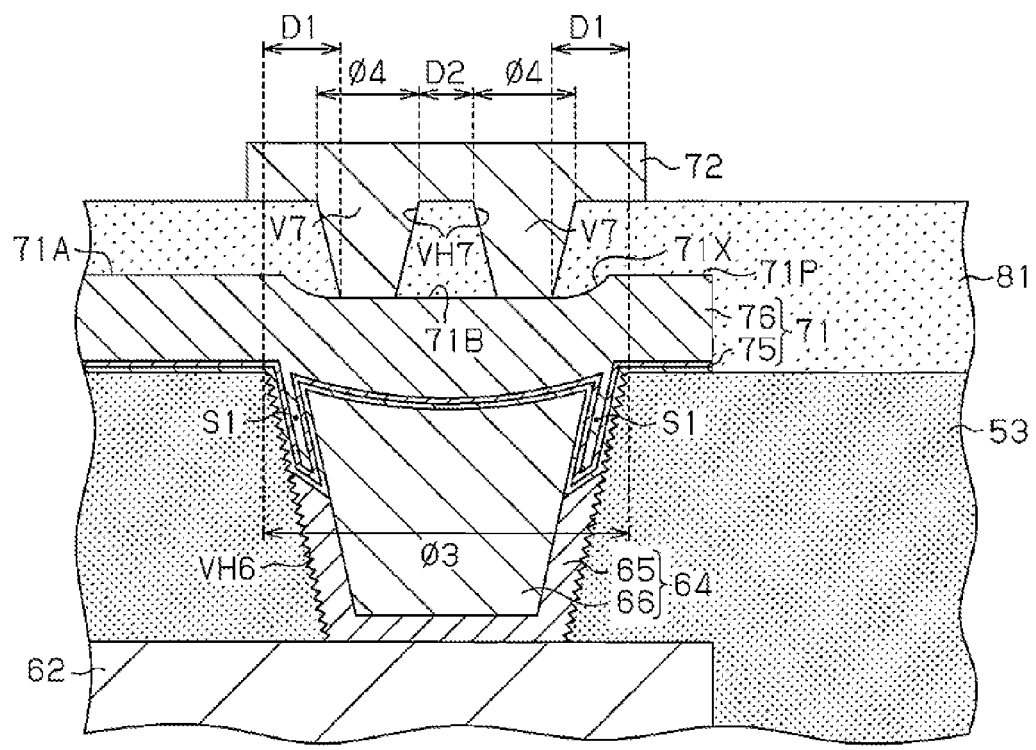
FIG. 17 is an enlarged cross-sectional view in which a part of a wiring board of a modification is enlarged.
Figure 18:
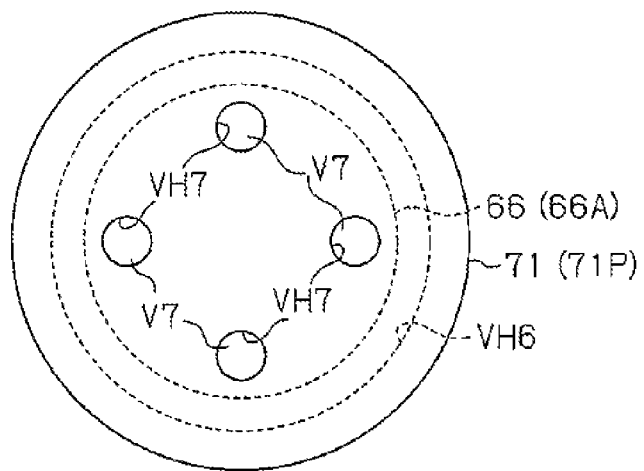
FIG. 18 is a schematic plan view illustrating a part of a wiring board of a modification.

As illustrated in FIGS. 17 and 18, a plurality of vias V7 (four in FIG. 18) may be connected to the single pad 71P. These vias V7 serve to electrically connect the wiring layer 71 and the wiring layer 72 together. For example, a plurality of vias V7 each of which is set to be smaller in diameter than the upper opening diameter $\Phi 3$ of the through hole VH6 may be connected to the single pad 71P. In other words, the upper opening diameter $\Phi 4$ (the diameter of the via V7) of the through hole VH7 filled with the via V7 is set to be smaller in diameter than the opening diameter $\Phi 3$ of the through hole VH6. For example, preferably, the opening diameter $\Phi 4$ of the through hole VH7 is about 0.1 to 0.2 times as large as the opening diameter $\Phi 3$ of the through hole VH6. The opening diameter $\Phi 3$ of the through hole VH6 may be, for example, about 50 to 70 µm, and the opening diameter $\Phi 4$ of the through hole VH7 may be, for example, about 5 to 10 µm.

Preferably, each via V7 (each through hole VH7) is formed in a region closer to the center than to the outer peripheral edge of the through hole VH6 on the pad 71P. For example, preferably, each via V7 (each through hole VH7) is formed directly on the upper end surface 66A of the metal layer 66. More specifically, preferably, the distance D1 from the outer peripheral edge of the through hole VH6 to the lower opening end of the through hole VH7 is set to be, for example, a length equal to about 15 to 30% of the opening diameter $\Phi 3$ of the through hole VH6 (e.g., about 10 to 15 µm). The via V7 is formed at such a position, and therefore it is possible to form the via V7 at a position at which it does not coincide with the gap S1 as viewed in plan view. It is possible to form the via V7 on the flat surface 71B by forming the via V7 at the aforementioned position even when the concave portion 71X is formed in the upper surface 71A of the wiring layer 71 (the pad 71P). These make it possible to improve the reliability of a connection between the via V7 and the pad 71P. The distance D2 between adjoining vias V7 may be, for example, about 10 to 15 µm.

It is possible to make the aspect ratio of each through hole VH7 small by connecting the plurality of small-diameter vias V7 to the single pad 71P in this way, and therefore it is possible to improve the filling properties of the via V7. This makes it possible to easily form a voidless via V7, and therefore it is possible to improve the reliability of a connection between the via V7 and the pad 71P.

Figure 19:
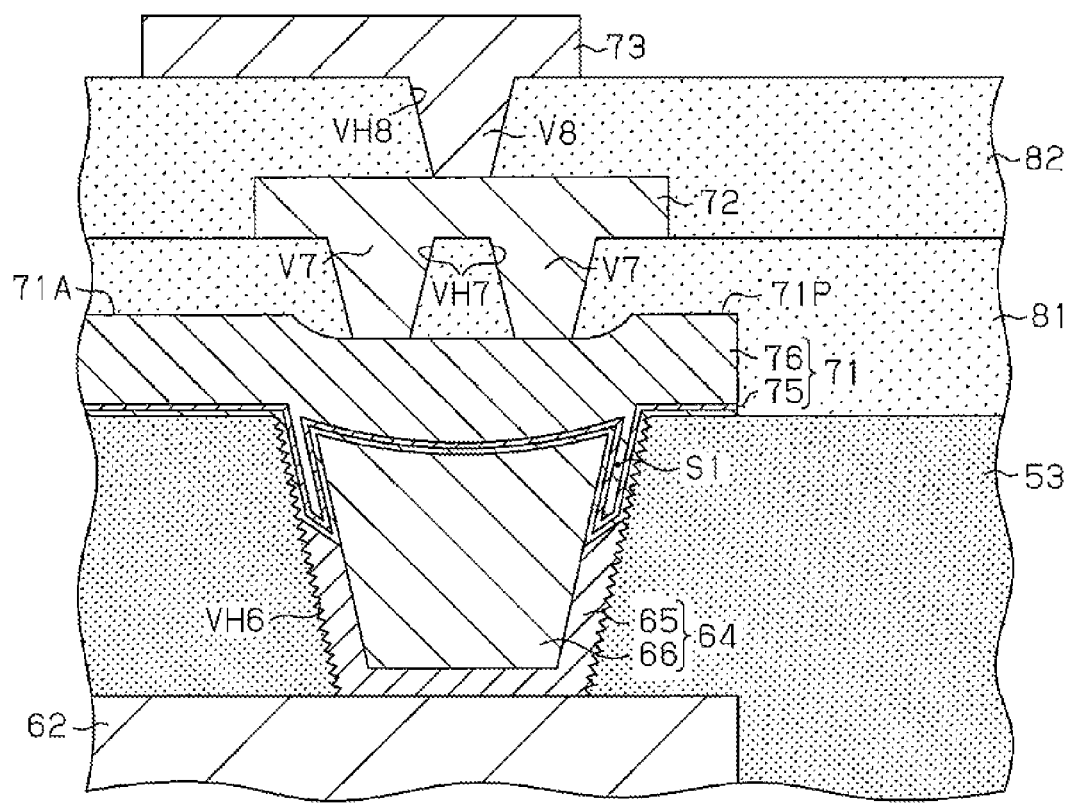
FIG. 19 is an enlarged cross-sectional view in which a part of a wiring board of a modification is enlarged.

As illustrated in FIG. 19, even when a plurality of vias V7 are connected to a single pad 71P, a via V8 is formed on the upper surface of the wiring layer 72, and the wiring layer 72 and the wiring layer 73 are electrically connected together through the via V8 in the same way as in the embodiment.

The lead wire 71D in the wiring layer 71 of the embodiment may be omitted. In other words, the wiring layer 71 may be used as a wiring layer having only the pad 71P.

Specific limitations are not imposed on cross-sectional shapes of the through holes VH1 to VH9 and the vias V1 to V5, 64, and V7 to V9 in the embodiment. For example, the through holes VH1 to VH9 and the vias V1 to V5, 64, and V7 to V9 may be each formed in a straight shape (a substantially rectangular shape as viewed in cross section).

Figure 20:
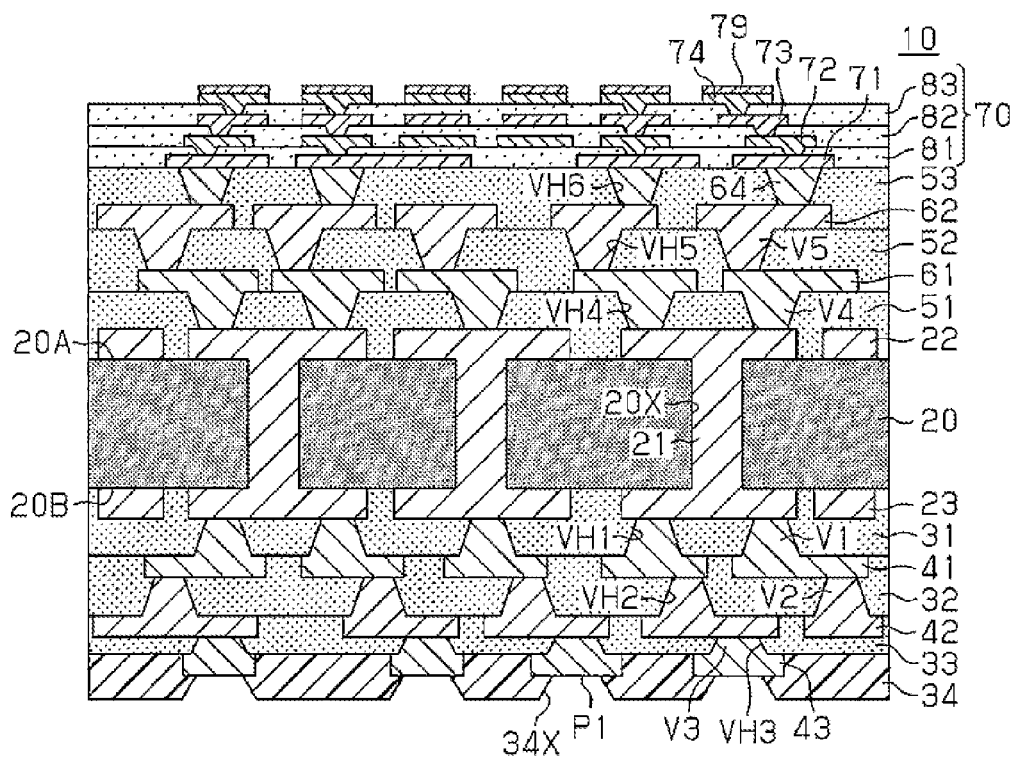
FIG. 20 is a schematic cross-sectional view illustrating a wiring board of a modification.

As illustrated in FIG. 20, the metal layer 79 may be formed on the uppermost wiring layer 74. A metal layer made of Ni layer/Au layer stacked in order from the upper surface of the wiring layer 74, a metal layer made of Ni layer/Pd layer/Au layer stacked in order therefrom, a metal layer made of Ni layer/Pd layer/Ag layer stacked in order therefrom, and a metal layer made of Ni layer/Pd layer/Ag layer/Au layer stacked in order therefrom may be examples of the metal layer 79. These Ni layer, Au layer, Pd layer, and Ag layer may be, for example, metal layers (electroless plating metal layers) formed by the electroless plating method.

An OSP film may be formed on the wiring layer 74.

The number of or the arrangement of the wiring layers 41, 42, 43, 61, and 62 and the insulating layers 31, 32, 33, 51, 52, and 53 in the wiring board 10 in the embodiment may be variously changed.

In a modified example, the insulating layer 53 only may be arranged between the wiring layer 22 and the fine wiring structure 70. The fine wiring structure 70 may be coupled to the wiring layer 22 of the core board 20 only via the insulating layer 53. In this example, the insulating layer 53 is stacked directly on the wiring layer 22 of the core board 20, the through hole VH6 is formed in the insulating layer 53 to expose the wiring layer 22, and the via 64 is formed in the through hole VH6. Thereafter, the fine wiring structure 70 is formed on the insulating layer 53. In this example, it is preferable that the insulating layer 33, the wiring layer 43 and the solder resist layer 34 only are stacked on the wiring layer 23 on the core board 20 to maintain a balance of the number of insulating layers and wiring layers between the upper and lower sides of the core board 20.

The number of or the arrangement of the wiring layers 71 to 74 and the insulating layers 81 to 83 in the fine wiring structure 70 in the embodiment may be variously changed.

Although the fine wiring structure 70 is formed on the core-added build up board that includes the core board 20 in the embodiment, specific limitations are not imposed on the structure of lower layers of the fine wiring structure 70. For example, the fine wiring structure 70 may be formed on a coreless board that does not include a core board.

The above-described examples (or one or more aspects thereof) may be used in combination with each other.

For purposes of clarification and consistency between the description and the claims, the following paragraph is provided:

The insulating layer 53 is an example of a first insulating layer in the claims. The wiring layer 62 is an example of a first wiring layer in the claims. The via 64 is an example of a first via in the claims. The via V7 is an example of a second via in the claims. The metal layer 65 is an example of an electroless plating layer in the claims. The metal layer 66 is an example of a first electrolytic plating layer in the claims. The wiring layer 71 is an example of a second wiring layer in the claims. The wiring layer 72 is an example of a third wiring layer in the claims. The wiring layer 74 is an example of an outermost wiring layer in the claims. The metal layer 76 is an example of a second electrolytic plating layer in the claims. The metal film 77 is an example of a first sputtered metal film in the claims. The metal film 78 is an example of a second sputtered metal film in the claims. The insulating layer 81 is an example of a second insulating layer in the claims. The through hole VH6 is an example of a first through hole in the claims. The through hole VH7 is an example of a second through hole in the claims.

The disclosure further encompasses various example(s) described below.

[Clause 1] According to one embodiment, a method of manufacturing a wiring board includes: forming a first insulating layer (53) so as to coat a first wiring layer (62); forming a first through hole (VH6) that exposes a surface of the first wiring layer (62) in a surface (53A) of the first insulating layer (53); forming a conductive layer that fills the first through hole (VH6) and coats the surface (53A) of the first insulating layer (53); forming a first via (64) that includes an end surface (64A/66A) exposed to the surface (53A) of the first insulating layer (53) while smoothing the surface (53A) of the first insulating layer (53) by grinding the conductive layer protruding from the surface (53A) of the first insulating layer (53) and the surface (53A) of the first insulating layer (53); forming a gap (S1) between a side surface of the first via (64) and an inner surface of the first through hole (VH6) while etching a part of the first via (64); and forming a second wiring layer (71) that includes a pad (71P) filling the gap (S1) and being greater in planar shape than the first through hole (VH6) on the end surface (64A/66A) of the first via (64) and on the surface (53A) of the first insulating layer (53).

[Clause 2] In the method according to clause 1, it is preferable that the forming the conductive layer includes: forming an electroless plating layer (65) that coats the surface (53A) of the first insulating layer (53), the inner surface of the first through hole (VH6), and the surface of the first wiring layer (62) exposed from the first through hole (VH6); and forming a first electrolytic plating layer (66) on the electroless plating layer (65), wherein the forming the gap (S1) includes selectively removing a part of the electroless plating layer (65) with respect to the first electrolytic plating layer (66).

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present invention have been described in detail, it should be understood that various changes, substitutions, and alterations could be made hereto without departing from the spirit and scope of the invention.

The invention claimed is:

1. A wiring board comprising:
a first insulating layer coating a first wiring layer;
a first through hole that is opened in a surface of the first insulating layer and that exposes a surface of the first wiring layer;
a first via arranged in the first through hole and including an end surface exposed to the surface of the first insulating layer;
a metal film disposed between the first insulating layer and the first via in the first through hole, wherein the metal film forms a gap between the first insulating layer and the first via in the first through hole; and
a second wiring layer that is stacked on the surface of the first insulating layer and on the end surface of the first via and includes a pad, the pad filling the gap and being greater in planar extent than the first through hole.

2. The wiring board according to claim 1, wherein the surface of the first insulating layer has surface roughness lower than that of an inner surface of the first through hole.

3. The wiring board according to claim 1, wherein the end surface of the first via includes a concave portion recessed toward the first wiring layer, and wherein the second wiring layer fills the concave portion.

4. The wiring board according to claim 1, wherein the second wiring layer includes a flatter surface than the end surface of the first via.

5. The wiring board according to claim 1, wherein the first via includes:
an electroless plating layer coating a part of an inner surface of the first through hole; and
a first electrolytic plating layer formed on the electroless plating layer, and
wherein the metal film includes
a first sputtered metal film that coats the surface of the first insulating layer, the end surface of the first via, the inner surface of the first through hole facing toward the gap, and a surface of the first via facing toward the gap, and
a second sputtered metal film formed on the first sputtered metal film, and
wherein the second wiring layer includes a second electrolytic plating layer formed on the second sputtered metal film.

6. The wiring board according to claim 5, wherein the electroless plating layer is a copper layer,
wherein the first sputtered metal film includes a metal selected from a group consisting of titanium, titanium nitride, tantalum, tantalum nitride, and chromium, and
wherein the second sputtered metal film includes a metal selected from a group consisting of copper or a copper alloy.

7. The wiring board according to claim 1, further comprising:
a second insulating layer coating the second wiring layer;
a second through hole that is opened in a surface of the second insulating layer and that exposes a surface of the pad;
a second via that fills the second through hole and is smaller in diameter than the first via; and
a third wiring layer that is stacked on the second insulating layer and that is connected to the second wiring layer through the second via,
wherein the pad is connected to a plurality of second vias each of which is defined above in a region in which the pad coincides with the first via as viewed in plan view.

8. The wiring board according to claim 7, wherein a thickness of the second insulating layer is smaller than a thickness of the first insulating layer, and a thickness of the second wiring layer is smaller than a thickness of the first wiring layer.

9. The wiring board according to claim 1, wherein the pad includes a projection extending toward the first wiring layer and filling the gap.

10. The wiring board according to claim 9, wherein the projection has a hollow conical frustum including an inclined inner surface and an inclined outer surface, the inclined inner surface holding the first via, and the inclined outer surface being bonded to an inner surface of the first through hole.

11. The wiring board according to claim 9, wherein the pad includes a central portion extending laterally inward from the projection and bonded to the end surface of the first via, and a flange portion extending laterally outward from the projection and surrounding an opened edge of the first through hole in the surface of the first insulating layer.

12. A semiconductor device comprising:

the wiring board of claim 1 including a fine wiring structure including the second wiring layer; and a semiconductor chip mounted on an outermost wiring layer of the fine wiring structure in a flip chip manner.

13. The wiring board according to claim 1, wherein an interfacial boundary of the pad and the end surface of the first via is located in the first through hole at a level lower than the surface of the first insulating layer in a thickness direction.

* * * * *